US010027296B2

(12) United States Patent
Gonzalez Esteban et al.

(10) Patent No.: US 10,027,296 B2
(45) Date of Patent: Jul. 17, 2018

(54) ARCHITECTURE OF A WIDEBAND DISTRIBUTED AMPLIFICATION DEVICE

(71) Applicants: THALES, Courbevoie (FR); CENTRE NATIONAL D'ETUDES SPATIALES (CNES), Paris (FR)

(72) Inventors: Eva Maria Gonzalez Esteban, Toulouse (FR); Philippe Voisin, Toulouse (FR); Aline Briand, Toulouse (FR); Bertrand Onillon, Toulouse (FR); Jean-Philippe Taisant, Toulouse (FR)

(73) Assignees: THALES, Courbevoie (FR); CENTRE NATIONAL D'ETUDES SPATIALES (CNES), Paris (FR)

( * ) Notice: Subject to any disclaimer, the term of this patent is extended or adjusted under 35 U.S.C. 154(b) by 11 days.

(21) Appl. No.: 15/287,598

(22) Filed: Oct. 6, 2016

(65) Prior Publication Data

US 2017/0104463 A1    Apr. 13, 2017

(30) Foreign Application Priority Data

Oct. 9, 2015 (FR) ..................... 15 02128

(51) Int. Cl.
*H03F 3/60* (2006.01)
*H03F 5/00* (2006.01)
(Continued)

(52) U.S. Cl.
CPC ......... *H03F 5/00* (2013.01); *H04B 7/18515* (2013.01); *H03F 1/18* (2013.01); *H03F 3/60* (2013.01);
(Continued)

(58) Field of Classification Search
CPC ............ H03F 3/60; H03F 3/602; H03F 3/605; H03F 2203/21109; H03F 3/607;
(Continued)

(56) References Cited

U.S. PATENT DOCUMENTS 4,198,611 A    4/1980  Eng
4,618,831 A *  10/1986 Egami ................. H01P 5/16
                                                330/53
(Continued)

FOREIGN PATENT DOCUMENTS

EP    2 763 314 A1    8/2014
WO   2008/017699 A1   2/2008

OTHER PUBLICATIONS

M. Daneshmand et al., "RF MEMS Satellite Switch Matrices," IEEE Microwave Magazine, vol. 12, No. 5, Aug. 1, 2011, pp. 92-109, XP011370160.

(Continued)

*Primary Examiner* — Khanh V Nguyen
(74) *Attorney, Agent, or Firm* — Baker & Hostetler LLP

(57) ABSTRACT

A distributed amplification device with p inputs, p outputs, p amplification paths comprises a redundant reservoir of n amplifiers including n-p back-up amplifiers, an input redundancy ring and an output redundancy ring formed by rotary switches, the input and output redundancy rings sharing the same technology. The internal amplification pathways associated with the n-p back-up amplifiers frame in an interlaced manner the internal amplification pathways associated with the p nominal amplifiers and the amplification paths of the routing configurations each pass through at least five rotary switches. The input and output redundancy rings are topologically and geometrically configured and the family of the routing configurations is chosen such that the electrical (Continued)

lengths of all the paths of one and the same routing configuration of the family are equal.

16 Claims, 16 Drawing Sheets

(51) Int. Cl.
  *H04B 7/185* (2006.01)
  *H04B 1/04* (2006.01)
  *H03F 1/18* (2006.01)

(52) U.S. Cl.
  CPC .............. *H03F 3/605* (2013.01); *H03F 3/607* (2013.01); *H04B 2001/0408* (2013.01)

(58) Field of Classification Search
  CPC . H03F 1/36; H03F 3/68; H03F 1/0288; H03F 1/07; H03F 3/211
  USPC ................. 330/53, 54, 84, 124 R, 286, 295
  See application file for complete search history.

(56) References Cited

U.S. PATENT DOCUMENTS

| | | | |
|---|---|---|---|
| 4,644,301 A | | 2/1987 | Hecht |
| 5,610,556 A | * | 3/1997 | Rubin ..................... H03F 3/602 330/295 |
| 7,088,173 B1 | * | 8/2006 | Rozario .................... H03F 1/02 330/124 R |
| 8,570,103 B2 | * | 10/2013 | Chang ................... H03F 1/0277 330/124 R |
| 8,581,663 B2 | * | 11/2013 | Tronche ................ H03F 1/3247 330/124 R |
| 2009/0243719 A1 | | 10/2009 | Voisin et al. |

OTHER PUBLICATIONS

P. Angeletti et al., "Multipart Power Amplifiers for Flexible Satellite Antennas and Payloads," Technical Feature, Microwave Journal, May 2010, pp. 96-108.

I. Hosoda et al., "Ka Band High Power Multipart Amplifier (MPA) Configured with TWTA for WINDS Satellite," IEEE 2007.

* cited by examiner

ARCHITECTURE OF A WIDEBAND DISTRIBUTED AMPLIFICATION DEVICE

CROSS-REFERENCE TO RELATED APPLICATIONS

This application claims priority to foreign French patent application No. FR 1502128, filed on Oct. 9, 2015, the disclosure of which is incorporated by reference in its entirety.

FIELD OF THE INVENTION

The present invention relates to a wideband distributed amplification device for a satellite, operating in a microwave radiofrequency band.

The applications of the invention relate to the telecommunications payloads, notably those which require the provision of a high power to a single beam, and more particularly the flexible telecommunications payloads.

BACKGROUND

In these applications, the operators who do not always have a very clear view as to the future distribution of the traffic (and therefore of the power) over the coverages addressed need to have a certain flexibility making it possible to adapt the satellite throughout its lifetime to the traffic needs resulting from the demand and the success of the service over different geographic zones. It is therefore important to be able to route the channels in a flexible way to the beams, that is to say, in such a way that the total number of channels handled by the payload can be distributed to the different beams in accordance with the traffic demand, throughout the lifetime of the satellite.

In order to ensure this flexibility, it is known practice to use a distributed amplification in which all the amplifiers placed in parallel amplify all the input channels of the payload.

According to this architecture, the channels are combined before amplification, the amplification is common to all the channels and each amplifier feeds all beams signals. This architecture is compatible with the amplification of any frequency distribution of the channels.

The article by P. Angeletti et al., entitled "Multiport Power Amplifiers for Flexible Satellite Antennas and Payloads," published in the Microwave Journal of May 2010, describes the general principle whereby the architecture of a telecommunications payload, reconfigurable in real time to distribute the radiofrequency (RF) power available as a function of the demand, is based on the possibility of making use of a reservoir or bank of radioelectric power, formed by a set of amplifiers arranged in parallel, and which implements a distributed amplification of one or more signals, each of the signals being amplified by all the amplifiers.

The article by P. Angeletti describes examples of architectures illustrating this general principle like the multibeam mobile communications repeater of the Japanese satellite ETS-VI, the mobile communications repeaters of the MTSAT-1 and MTSAT-2 satellites, and the mobile communications payload of the Inmarsat-3 satellite.

The article by I. Hosoda et al., entitled "Ka band high power multiport amplifier (MPA) configured with TWTA for WINDS satellite," IEEE 2007, describes the architecture of a reconfigurable telecommunication payload using the principle of distributed amplification.

While the principle of distributed amplification as described above addresses the problem of real-time adaptation of the payload available RF power to traffic requirements, problems arise of the paralleling of amplifiers over a total transmission band wider than those currently used and the implementation of a redundancy scheme (back-up amplifiers) compatible with this wideband constraint.

In effect, the conventional current systems operate over relatively narrow bands. For example, the multiport amplifier MPA of the WINDS satellite operates in the Ka band with 6% of the useful band. In these conventional systems, amplifiers individual adjustment is typically performed at the central frequency of the band to be handled, which limits the correction over the entire band. When seeking to increase the transmission bandwidth, gain and phase dispersion increases at the edges of the band, and it exceeds the dispersion that is "acceptable" to have a good power recombination.

Now, operation of a distributed amplification device over wider useful transmission bands is desirable, for example a useful band of 2 GHz at the frequency of 11.7 GHz for the Ku band.

The patent application WO 2008/017699 A1 describes a solution to the above problem by proposing an architecture in which a distributed amplification device amplifies and distributes in a flexible way a plurality of $s$ input transmission channels to an output corresponding to an antenna beam with acceptable performance in terms of amplifiers amplitude and phase dispersion adjustment over a wide frequency band.

The proposed distributed amplification device comprises frequency band combination means comprising $s$ inputs for receiving the $s$ transmission channels and q outputs for respectively supplying the transmission channels grouped together within q frequency bands, power amplification means including p active amplifiers, arranged in parallel for the channels distributed amplification, and gain and phase setting means associated with the p power amplifiers over the q frequency bands.

However, even though this architecture allows a gain and phase alignment between amplifiers over a wide frequency bandwidth and thus the use of paralleled amplifiers in flexible payloads multichannel applications, distribution of the transmission channels according to the q frequency bands and the use of p active amplifiers induce the need to use q*p phase-shifters/attenuators, which results in a more complex solution because of the use of controllable phase-shifters and attenuators.

Furthermore, the proposed architecture describes settings made upstream of the eight amplifiers set considered in principle to be nominal amplifiers and therefore the settings of a single nominal routing configuration. The document WO 2008/017699 A1 does not describe the consideration of gain and phase setting means for effects induced by routing reconfigurations which implement back-up configurations involving one or more back-up amplifiers.

The effects induced by a switch to the back-up amplifiers are caused notably by the introduction of electrical length disparities between the active amplification paths created upon the reconfiguration by input and output redundancy rings, and these effects increase the gain and phase dispersion of the active amplification pathways, all the more so as the useful transmission total bandwidth increases.

Thus, for all the architectures of redundant distributed amplification devices known to date, when seeking to extend the useful transmission band to achieve a wideband of use of the reservoir within the observance of an acceptable gain and phase dispersion of the active amplification pathways of one and the same configuration, an amplitude and phase equalization of said amplification pathways or paths of the reservoir by conventional gain and phase setting means over all of the nominal and back-up operating configurations of the reservoir does not allow for such wideband extension.

A first technical problem is to propose an architecture of a redundant distributed amplification device which reduces, over a wideband, the gain and phase dispersion of the active amplification pathways of one and the same configuration.

A second technical problem, connected to the first problem, is to propose a redundant distributed amplification device which makes it possible, with sufficient performance in terms of acceptable dispersion, to equalize, in amplitude and in phase over a wideband, the internal active amplification paths of all the operating configurations of the device.

SUMMARY OF THE INVENTION

To this end, the subject of the invention is a distributed amplification device, intended for a communications payload of a satellite, comprising a distributed amplification reservoir for amplifying a first plurality of a first integer number p greater than or equal to 2 of radiofrequency (RF) input signals, received by a first input port of input terminals, mutually identical to within a phase and mutually phase-shifted according to a predetermined phase law, into a second plurality of p amplified RF signals supplied by a second output port of output terminals, associated respectively with the input terminals of the first port according to the same order, the distributed amplification reservoir comprising:

a set of a second integer number n, greater than p and less than or equal to 2p+1, of amplifiers arranged electrically in parallel and respectively forming internal amplification pathways, mutually insulated electromagnetically and equalized, respectively numbered by a row index varying from 1 to the second integer number n, the set of the n amplifiers being composed of a first series of p nominal radiofrequency amplifiers and of a second series of n-p back-up amplifiers, an input redundancy ring, formed by a first array of four-pole rotary switches, and an output redundancy ring, formed by a second array of four-pole rotary switches, the input and output redundancy rings being connected respectively between the first input port and a third port of input terminals of the set of the n̲ amplifiers and between a fourth port of output terminals of the set of the n̲ amplifiers and the second output port, to implement a family of routing configurations comprising a nominal routing configuration which uses the p nominal amplifiers of the first series as active amplifiers, and one or more back-up routing configurations which each use at least one of the n-p back-up amplifiers out of the p active amplifiers selected from the set of the n amplifiers; the distributed amplification device being characterized in that:

the input and output redundancy rings use similar propagation conditions; and the input and output redundancy rings are topologically and geometrically configured such that each routing configuration of the family comprises a set of p independent distributed amplification paths, each amplification path individually including an input terminal of the first port, the output terminal of the second port associated with the input terminal of the first, an active amplifier and its row number, first passive links connected in series and passing through at least three rotary switches of the input redundancy ring and linking the input terminal of the first port to the input terminal of the active amplifier, and second passive links connected in series and passing through at least one switch of the output redundancy ring and linking the output terminal of the active amplifier to the output terminal of the second port; and the electrical lengths of all the paths of one and the same routing configuration of the family are equal.

According to particular embodiments, the distributed amplification device comprises one or more of the following features:

the input and output redundancy rings are topologically and geometrically configured and the family of the routing configurations is chosen such that the electrical lengths of all the paths of all the family are equal;

upon a reconfiguration of a first routing configuration of the family to a second routing configuration of the family, the differences in electrical lengths deriving from the reconfiguration of the input ring are compensated by the reconfiguration of the output redundancy ring for each modified distributed amplification path;

the same technology is shared by the input and output redundancy rings, and is included in the set formed by the coaxial technology and the waveguide technology;

independently of all the paths of all the routing configurations of the family of the reservoir, the rotary switches of one and the same amplification path are passed through globally in the same way in terms of the number of rotary switches passed through of one and the same path and the numerical distribution of the switching configurations of the rotary switches activated in this path;

the family of the routing configurations comprises a nominal routing configuration which uses the p nominal amplifiers of the first series as active amplifiers, and one or more back-up routing configurations which each use at least one of the n-p back-up amplifiers out of the p active amplifiers selected from the set of the n amplifiers; back-up routing configurations being determined to maintain a maximum amplification capacity of the reservoir in all failure cases of at most p amplifiers out of the set of the n amplifiers when p is less than or equal to n, and at most p+1 amplifiers out of the set of the n amplifiers when n is equal to 2p+1;

the first array of the interconnected switches of the input redundancy ring is arranged according to a first matrix of which the elements are the input four-pole rotary switches and form first nodes arranged in at least two columns and n̲ rows, the rows corresponding to the rows of the internal amplification pathways, p first upstream end nodes of a first upstream end column being connected to the input terminals of the first port and p+r first downstream end nodes of a first downstream end column being connected respectively one by one to the input terminals of the p+r amplifiers; and the second array of the interconnected switches of the output redundancy ring is arranged according to a second matrix of which the elements are the output rotary switches and form second nodes arranged in at least one column and n̲ rows, the n̲ rows corresponding to the rows of the internal amplification pathways with the same numbering, p second downstream end nominal nodes of a second downstream end column being connected to the output terminals of the second port and p+r second upstream end nodes of a second upstream end column being connected upstream respectively to the output terminals of the amplifiers according to one and the same rank i, when the second matrix comprises at least two second columns; or p second downstream and upstream end nodes of a single second end column connected downstream to the output terminals of the second port and connected upstream respectively to the output terminals of the nominal amplifiers according to one and the same rank i, and r second remaining upstream end nodes connected upstream respectively to the output terminals of the amplifiers when the second matrix comprises a single second column;

at least one switch out of the switches of the first upstream end column and of the second upstream end column is replaced by a link of the same electrical length;

the first matrix comprises two or three columns and the second matrix comprises a single column;

the distributed amplification reservoir comprises amplitude and phase setting means, arranged upstream and/or downstream of each amplifier between the input and output redundancy rings, preferably upstream when the amplifiers are power amplifiers and preferably downstream when the amplifiers are low-noise amplifiers; and the amplitude and phase setting means are configured to balance all the distributed internal amplification paths of the operating configurations provided for the reservoir in a wide frequency band;

the amplitude and phase setting means of each distributed internal amplification path comprise an amplitude attenuator, a first phase-shifter and a second phase-shifter, the first phase-shifter being a phase-shifter of the "electrical length" type included in the set formed by the "phase trimmers", and the second phase-shifter being a phase-shifter with constant phase shift over the entire wide frequency band; and the amplitude attenuators, the first phase-shifters and the second phase-shifters are configured respectively to balance the gains of the amplifiers over the wide frequency band, bring close together the phase variations as a function of the frequency over a wide frequency band of all the distributed internal amplification paths of the operating configurations provided for the reservoir, compensate for the dispersions of the constant phase offsets introduced by the active amplifiers of all the distributed internal amplification paths of the operating configurations provided for the reservoir;

the amplifiers of the reservoir are power amplifiers included in the set formed by the amplifiers using travelling wave tubes (TWTAs) and the solid state amplifiers (SSPAs), and the distributed amplification device is a multiport power amplifier further comprising an input power equal distribution network over the input terminals of the input port; and an output power distribution network;

the input power distribution network is a beam forming input network and the output power distribution network is an output forming network;

the amplifiers of the distributed amplification reservoir are low-noise solid state amplifiers and the reception stage of an active reception antenna;

the amplification device described above further comprises frequency band combination means comprising n inputs to receive n transmission channels and q outputs to respectively supply channels grouped together within q frequency bands into q frequency band signals; and a set of dividers for dividing up the power of the q band signals over the p inputs of the input port of the amplification reservoir; and gain and phase setting means corresponding to the p amplifiers over the q frequency bands;

the gain and phase setting means comprise p times q phase-shifters and attenuators arranged within the set of dividers.

BRIEF DESCRIPTION OF THE DRAWINGS

The invention will be better understood on reading the following description of a number of embodiments, given purely by way of example and with reference to the drawings in which.

DETAILED DESCRIPTION

Figure 1:
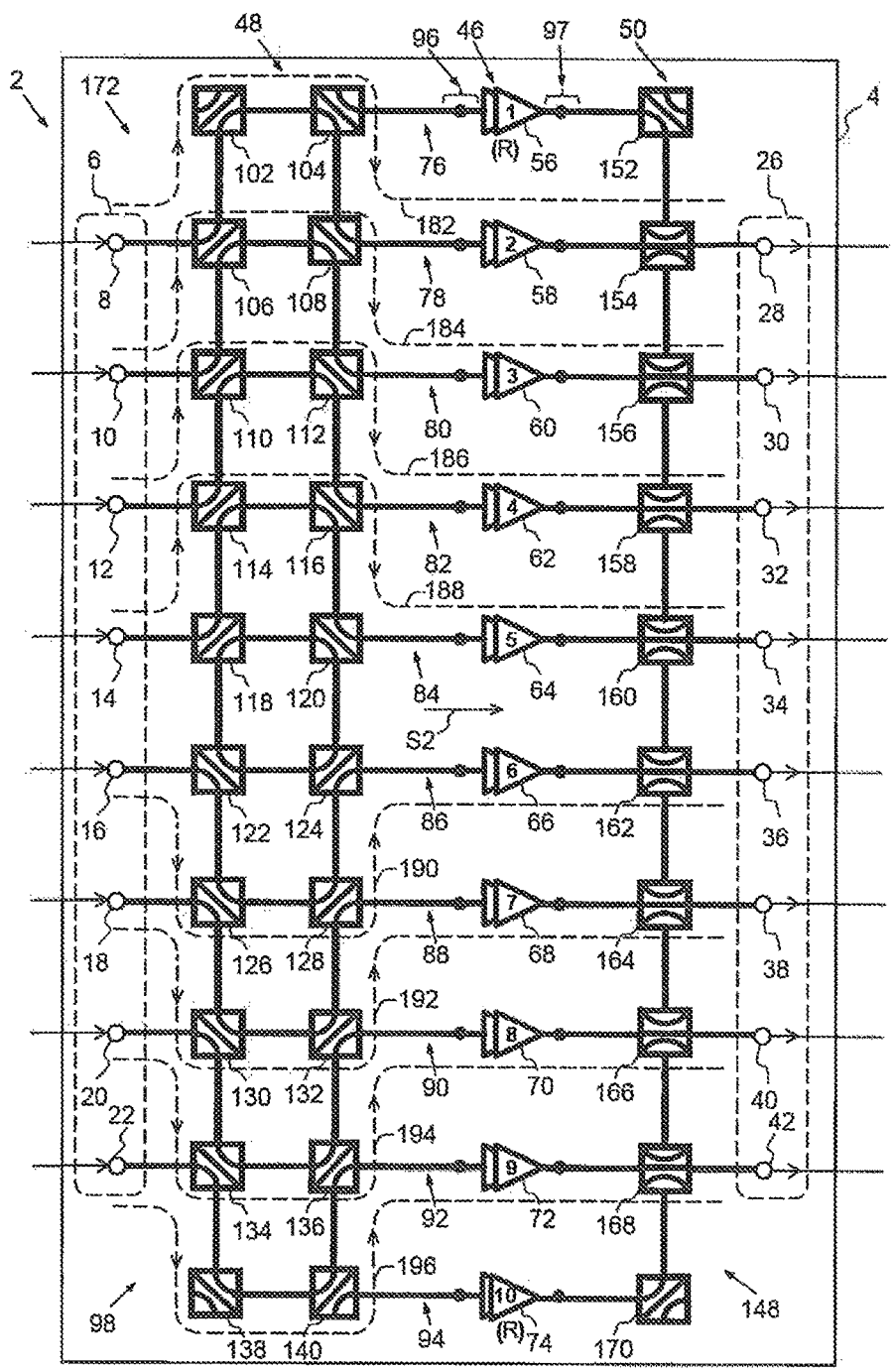
FIG. 1 is a view of an architecture of a first embodiment of a distributed amplification device according to the invention in a nominal routing configuration of an amplification reservoir.

According to FIG. 1 and a first embodiment, a distributed amplification device 2, intended for a communications payload of a satellite not represented in FIG. 1, comprises a distributed radiofrequency RF amplification reservoir 4 for amplifying a first plurality of a first integer number p of input radiofrequency signals, received by a first input port 6 of input terminals 8, 10, 12, 14, 16, 18, 20, 22, mutually identical to within a phase and mutually phase-shifted according to a predetermined phase law, in a second plurality of p amplified RF signals delivered by a second output port 26 of output terminals 28, 30, 32, 34, 36, 38, 40 and 42.

The distributed amplification reservoir 4 comprises a set 46 of a second integer number n of amplifiers connected between an input or upstream redundancy ring 48 and an output or downstream redundancy ring 50, the direction from upstream to downstream being the direction of travel of a distributed amplified signal from an input terminal of the input port to an output terminal through an amplifier. The second integer number n of amplifiers is generally greater than or equal to 3, and assumed here by way of example to be equal to 10.

The n amplifiers of the set 46, here of which there are ten, respectively designated by 56, 58, 60, 62, 64, 66, 68, 70, 72 and 74, are arranged electrically in parallel and respectively define or form internal pathways or amplification lines 76, 78, 80, 82, 84, 86, 88, 90, 92 and 94, mutually insulated electromagnetically and respectively numbered by a row index i varying from 1 to the second integer number n from top to bottom in FIG. 1.

The set 46 of the ten amplifiers 56, 58, 60, 62, 64, 66, 68, 70, 72 and 74 is composed of a first series of p nominal radiofrequency amplifiers, formed here by the eight amplifiers 58, 60, 62, 64, 66, 68, 70, 72, and a second series of n-p back-up amplifiers, formed here by the two amplifiers 56, 74.

The eight amplifiers 58, 60, 62, 64, 66, 68, 70, 72 of the first series are provided to operate in a nominal configuration of the reservoir.

The two amplifiers 56, 74 of the second series are provided to operate in back-up configurations of the reservoir 4 in case of failure of at most two amplifiers of the set of the amplifiers 56, 58, 60, 62, 64, 66, 68, 70, 72 and 74, the internal amplification pathways 76, 94 associated respectively with the two back-up amplifiers 56, 74 here completely surrounding the internal amplification pathways 78, 80, 82, 84, 86, 88, 90, 92, associated respectively with the eight nominal amplifiers 58, 60, 62, 64, 66, 68, 70, 72.

The input and output redundancy rings 48, 50 are connected respectively between the first input port 6 and a third port 96 of input terminals of the set of the amplifiers 46 and between a fourth port 97 of output terminals of the set of the amplifiers 46 and the second output port 26.

Each internal amplification pathway 76, 78, 80, 82, 84, 86, 88, 90, 92 and 94, respectively defined by its associated amplifier 56, 58, 60, 62, 64, 66, 68, 70, 72 and 74, is the amplification line included between the input terminal of said associated amplifier, element of the third port 96, and the output terminal of said associated amplifier, element of the fourth port 97.

The input redundancy ring 48 is formed by a first array 98 of four-pole rotary switches, here twenty rotary switches 102, 104, 106, 108, 110, 112, 114, 116, 118, 120, 122, 124, 126, 128, 130, 132, 134, 136, 138, 140.

The output redundancy ring 50 is formed by a second array 148 of four-pole rotary switches, here ten rotary switches 152, 154, 156, 158, 160, 162, 164, 166, 168, 170.

The input and output redundancy rings 48, 50 are connected respectively between the first input port 6 and the third port 96 of input terminals of the set 46 of the ten amplifiers and between the fourth port 97 of output terminals of the set 46 of the ten amplifiers and the second output port 26, to implement a family of routing configurations comprising a nominal routing configuration, illustrated in FIG. 1, which uses the eight nominal amplifiers of the first series as active amplifiers, and one or more back-up routing configurations which each use at least one of the two back-up amplifiers out of the eight active amplifiers selected from the set of the ten amplifiers, and which are described for example in FIGS. 3 to 7.

The input 48 and output 50 redundancy rings are topologically and geometrically configured such that each routing configuration of the family includes a set of eight independent distributed amplification paths, each amplification path individually including an input terminal of the first port 6, the output terminal of the second port 26 associated with the input terminal of the first, an active amplifier and its row number, first passive links connected in series and passing through at least three four-pole rotary switches of the input redundancy ring and linking the input terminal of the first port to the input terminal of the active amplifier, and second passive links connected in series and passing through at least one four-pole switch of the output redundancy ring and linking the output terminal of the active amplifier to the output terminal of the second port, and the electrical lengths of all the paths of one and the same routing configuration of the family are equal.

The total number of four-pole rotary switches passed through by each path is greater than or equal to 5.

According to FIG. 1, the distributed amplification reservoir 4 is configured in the nominal routing configuration, defined by p (p=8) paths, here the eight paths 182, 184, 186, 188, 190, 192, 194, 196, 198, represented by dotted lines from top to bottom in FIG. 1.

The first path 182 starts from the input terminal 8 of the first port 6, then passes in succession through the input switches 106, 102, 104, 108, the nominal amplifier 58, the output switch 154, and reaches the output terminal 28 of the second port.

The second path 184 starts from the input terminal 10 of the first port 6, then passes in succession through the input switches 110, 106, 108, 112, the nominal amplifier 60, the output switch 156, and reaches the output terminal 30 of the second port 26.

The third path 186 starts from the input terminal 12 of the first port then passes in succession through the input switches 114, 110, 112, 116, the nominal amplifier 62, the output switch 158, and reaches the output terminal 32 of the second port 26.

The fourth path 188 starts from the input terminal 14 of the first port, then passes in succession through the input switches 118, 114, 116, 120, the nominal amplifier 64, the output switch 160, and reaches the output terminal 34 of the second port.

The fifth path 190 starts from the input terminal 16 of the first port, then passes in succession through the input switches 122, 126, 128, 124, the nominal amplifier 66, the output switch 162, and reaches the output terminal 36 of the second port.

The sixth path 192 starts from the input terminal 18 of the first port 6, then passes in succession through the input switches 126, 130, 132, 128, the nominal amplifier 68, the output switch 164, and reaches the output terminal 38 of the second port 26.

The seventh path 194 starts from the input terminal 20 of the first port, then passes in succession through the input switches 130, 134, 136, 132, the nominal amplifier 70, the output switch 166, and reaches the output terminal 40 of the second port 26.

The eighth path 196 starts from the input terminal 22 of the first port, then passes in succession through the input switches 134, 138, 140, 136, the nominal amplifier 72, the output switch 168, and reaches the output terminal 42 of the second port.

It should be noted that when two different paths of one and the same configuration pass through one and the same four-pole rotary switch, the two internal switching paths selected of the rotary switch link two different pairs of poles, are separated and electromagnetically insulated.

The input and output redundancy rings share one and the same technology. The same technology shared by the input and output redundancy rings 48, 50 is included in the set formed by the coaxial technology and the waveguide technology.

That makes it possible to avoid, for example, the problem of wideband equalization of the routing paths produced by the association of an input ring in coaxial technology and a waveguide output ring. In effect, since the electrical lengths in guide mode do not have equivalent electrical isolength in coaxial technology in a continuous frequency band (an electrical length in guide mode can be equalized with a coaxial electrical length only at a single frequency), the use of one and the same routing technology on the two rings makes it possible to solve this problem. In power applications where the use of an output ring with guides is necessary, that will involve using the same waveguide technology for the input ring although power requirements urge the use of a lighter and less bulky technology.

Thus, in the case where the amplifiers are travelling wave tubes TWTs and the output section is in guide mode, the input redundancy ring also becomes guide mode.

Generally, the input and output redundancy rings use technologies, possibly different, that implement similar propagation conditions. When the technologies used by the input and output redundancy rings are different and implement similar propagation conditions, it means that the switches used by said rings have similar transfer function or in-band responses that are identical to within a uniform amplification factor.

Figure 2A:
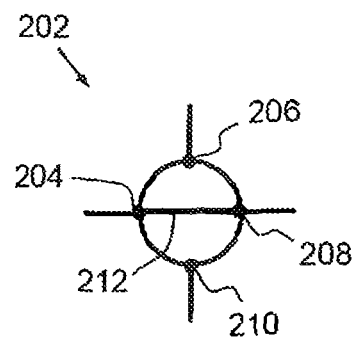
FIGS. 2A, 2B, 2C are views of the possible configurations of a four-pole rotary switch of a redundancy ring of the distributed amplification device of FIG. 1.
Figure 2B:
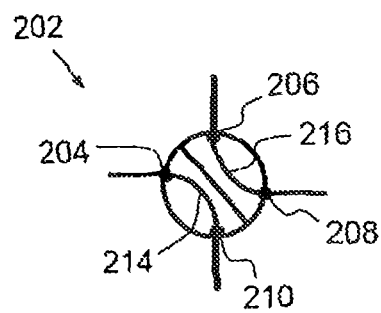
Figure 2C:
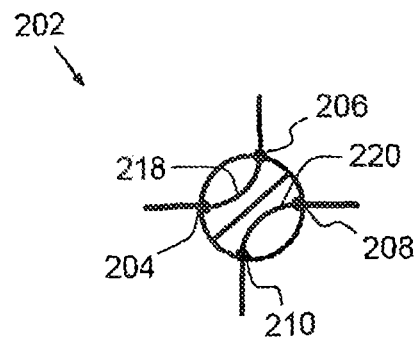

According to FIGS. 2A, 2B, 2C, three switching configurations of a generic four-pole rotary switch 202, used in the implementation by the redundancy rings 48, 50 of the routing configurations provided for the amplification reservoir, are illustrated. The generic four-pole rotary switch 202, sometimes referred to in the literature as "T switch" comprises four fixed poles or connection terminals 204, 206, 208, 210, respectively hereinafter called first pole, second pole, third pole and fourth pole.

According to a first switching configuration of the rotary switch 202 represented in FIG. 2A and following the sending of a first internal configuration command to the switch 202, the first pole 204 and the third pole 208 are interconnected by a first internal conductive passive link 212 whereas the second and fourth poles are electrically insulated within the switch by being deprived of any connection to an internal conductive link.

According to a second switching configuration of the rotary switch 202 represented in FIG. 2B and following the sending of a second internal configuration command to the rotary switch 202, the first pole 204 and the fourth pole 210 are interconnected by a second internal conductive passive link 214 whereas the second and third poles are interconnected by a third internal conductive passive link 216.

According to a third switching configuration of the rotary switch 202 represented in FIG. 2C and following the sending of a third internal configuration command to the rotary switch 202, the first pole 204 and the third pole 206 are interconnected by a fourth internal conductive passive link 218 whereas the third and fourth poles are interconnected by a fifth internal conductive passive link 220.

This set of configurations of the rotary switch can be used for cold and/or hot amplifier redundancy schemes.

It should be noted that a variant of the first switching configuration of the rotary switch represented in FIG. 2A exists in the case of a cold amplifier redundancy scheme in which the absence of link between the second pole and the fourth pole is replaced by an electrical link that is separated and electromagnetically insulated from the first electrical link 212.

The input and output redundancy rings are topologically and geometrically configured and the nominal configuration is chosen for the electrical lengths of all the paths of this nominal routing configuration to be equal.

The electrical length of a path is here defined as the difference in the phases aggregated at the input and at the output of a transmission line portion included between the input terminal and the output terminal of the path, representative of the series of passive links included between these two terminals, passed through by a radioelectric signal at a predetermined frequency lying in the useful transmission band, for example at the central frequency. The effect of the active amplifier is not taken into account as active component, it being assumed that all the amplifiers of the reservoir are identical or equalized in amplitude and in phase.

Independently of all the paths of the nominal configuration chosen, the rotary switches of one and the same path are passed through globally in the same way in terms of the number of rotary switches passed through of one and the same path and of the numerical distribution of the switching configurations of the rotary switches activated in this path.

In effect, for each path 182, 184, 186, 188, 190, 92, 194, 196, the number of rotary switches is equal to 5 and the switching configurations are divided up as one first, two second and two third rotary switch configurations.

Figure 3:
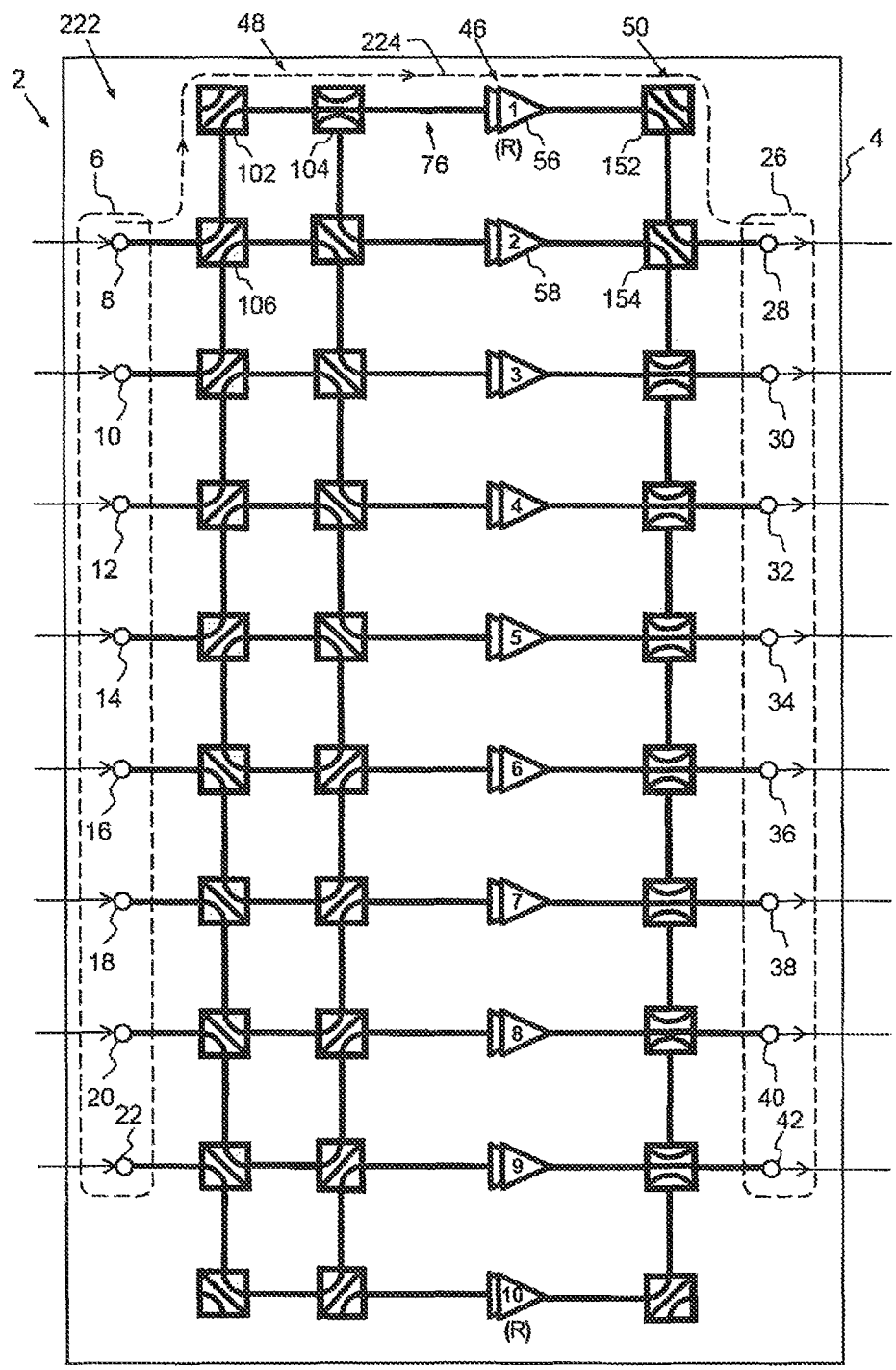
FIG. 3 is a view of a first back-up routing configuration of the distributed amplification device of FIG. 1 corresponding to a single failure of the amplifier of rank 2.

According to FIG. 3, a first back-up routing configuration 222 of the distributed amplification device 2 of FIG. 1 remedies a single failure of the amplifier 58 of rank 2.

The paths of the first back-up routing configuration are identical to those of the nominal configuration 172 except for the first nominal path 182 which is replaced by a first back-up path 224 specific to the first back-up configuration 222.

The first back-up path 224 starts from the input terminal 8 of the first port 6, then passes in succession through the input switches 106, 102, 104, the back-up amplifier 58, the output switches 152, 154 and reaches the output terminal 28 of the second port 26.

The electrical lengths of all the paths of this first back-up routing configuration 222 are equal to one another. They are even equal to the electrical length of the paths of the nominal configuration 172.

Similarly, independently of all the paths of the first back-up configuration chosen 222, the rotary switches of one and the same path are globally passed through in the same way in terms of the number of rotary switches passed through of one and the same path, here five switches, and of the numerical distribution of the switching configurations of the rotary switches activated in the path which here remains that of one first configuration (FIG. 2A), two second configurations (FIG. 2B), two third configurations (FIG. 2C) of a generic rotary switch 202.

Figure 4:
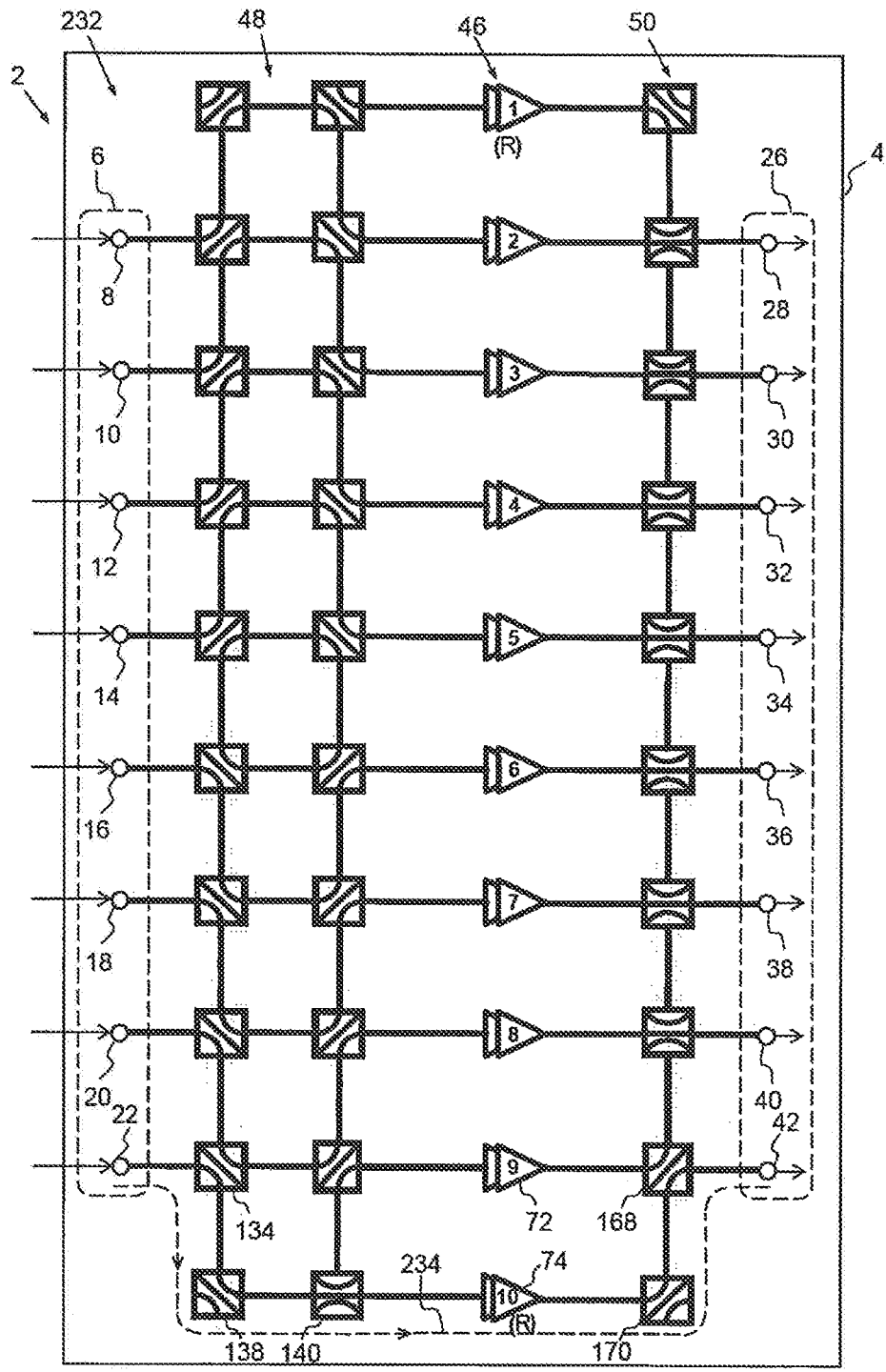
FIG. 4 is a view of a second back-up routing configuration of the distributed amplification device of FIG. 1 corresponding to a single failure of the amplifier of rank 9.

According to FIG. 4, a second back-up routing configuration 232 of the distributed amplification device 2 of FIG. 1 remedies a single failure of the nominal amplifier 72 of rank 9.

The paths of the second back-up routing configuration 232 are identical to those of the nominal routing configuration 172 except for the eighth nominal path 196 which is replaced by an eighth back-up path 234 specific to the second back-up configuration 232.

The eighth back-up path 234 starts from the input terminal 22 of the first port 6 then passes in succession through the input switches 134, 138, 140, the amplifier 74, the output switches 170, 168 and reaches the output terminal 42 of the second port 26.

The electrical lengths of all the paths of this second back-up routing configuration 232 are equal to one another and even equal to the common electrical length of the paths of the nominal configuration 172.

Similarly, independently of all the paths of the second back-up configuration chosen 232, the rotary switches of one and the same path are globally passed through in the same way in terms of the number of rotary switches passed through of one and the same path, here five switches, and of the numerical distribution of the switching configurations of the rotary switches activated in this path which here remains, like the nominal routing configuration 172 of the reservoir 2, that of one first configuration, two second and two third configurations of a generic rotary switch 202.

Figure 5:
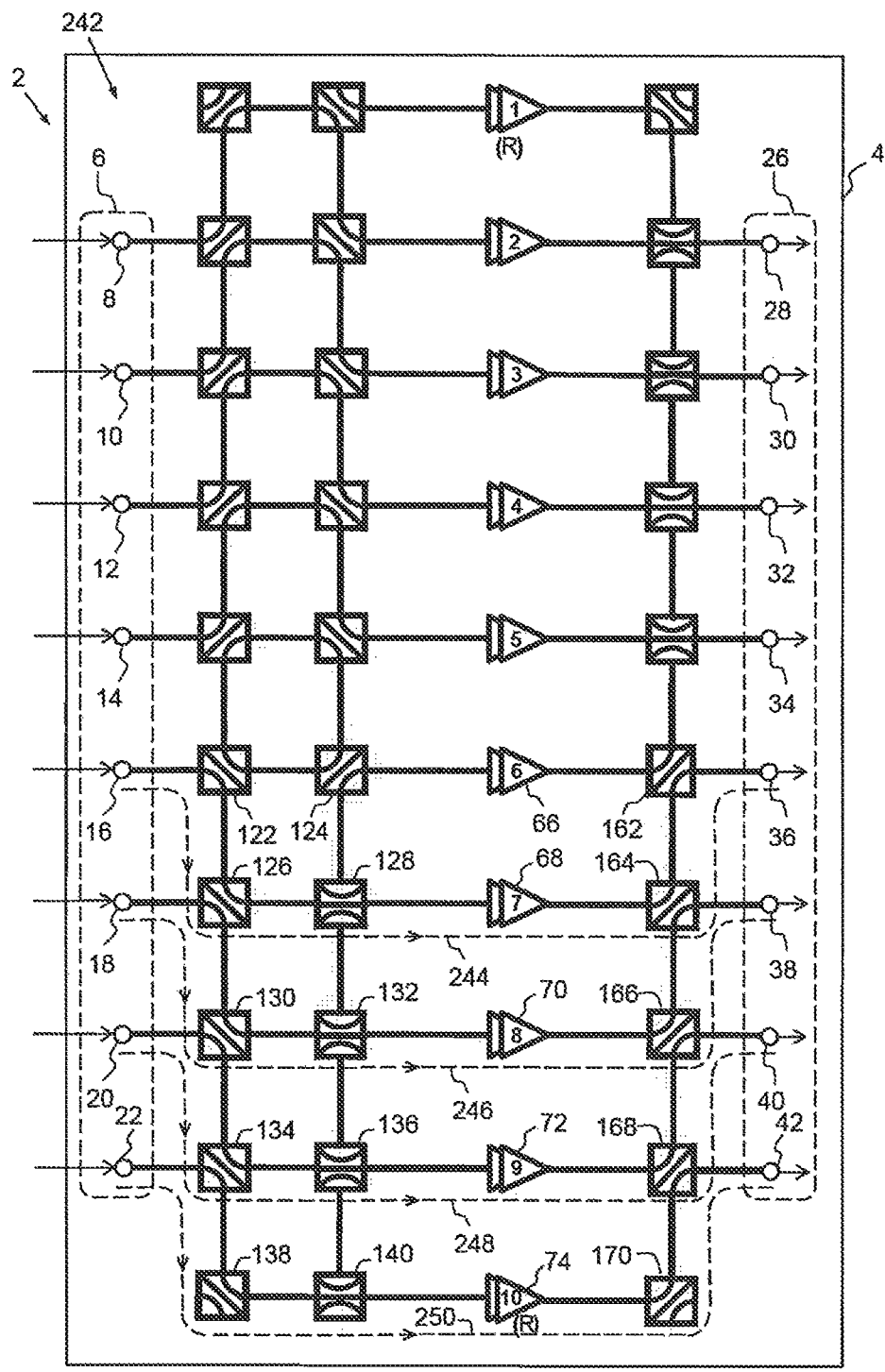
FIG. 5 is a view of a third back-up routing configuration of the distributed amplification device of FIG. 1 corresponding to a single failure of the amplifier of rank 6.

According to FIG. 5, a third back-up routing configuration 242 of the distributed amplification device of FIG. 1 remedies a single failure of the nominal amplifier 66 of rank 6.

The paths of the third back-up routing configuration 242 are identical to those of the nominal routing configuration 172 except for the fifth, sixth, seventh, eighth nominal paths 190, 192, 194, 196 which are replaced respectively by the fifth, sixth, seventh, eighth back-up paths 244, 246, 248, 250 specific to the third back-up configuration 242.

The fifth back-up path 244 starts from the input terminal 16 of the first port 6, then passes in succession through the input switches 122, 126, 128, the nominal amplifier 68, the output switches 164, 162 and reaches the output terminal 36 of the second port 26.

The sixth back-up path 246 starts from the input terminal 18 of the first port 6, then passes in succession through the input switches 126, 130, 132, the nominal amplifier 70, the output switches 166, 164 and reaches the output terminal 38 of the second port 26.

The seventh back-up path 248 starts from the input terminal 20 of the first port 6, then passes in succession through the input switches 130, 134, 136, the nominal amplifier 72, the output switches 168, 166 and reaches the output terminal 40 of the second port 26.

The eighth back-up path 248 starts from the input terminal 22 of the first port 6, then passes in succession through the input switches 134, 138, 140, the back-up amplifier 74, the output switches 170, 168 and reaches the output terminal 42 of the second port 26.

The electrical lengths of all the paths of this third routing configuration 242 are equal to one another and even equal to the common electrical length of the paths of the nominal configuration 172.

Similarly, independently of all the paths of the third back-up configuration chosen 242, the rotary switches of one and the same path are passed through globally in the same way in terms of the number of rotary switches passed through of one and the same path, here five switches, and of the numerical distribution of the switching configurations of the rotary switches activated in this path which here remains that of one first configuration, two second and two third configurations of a generic rotary switch 202.

Figure 6:
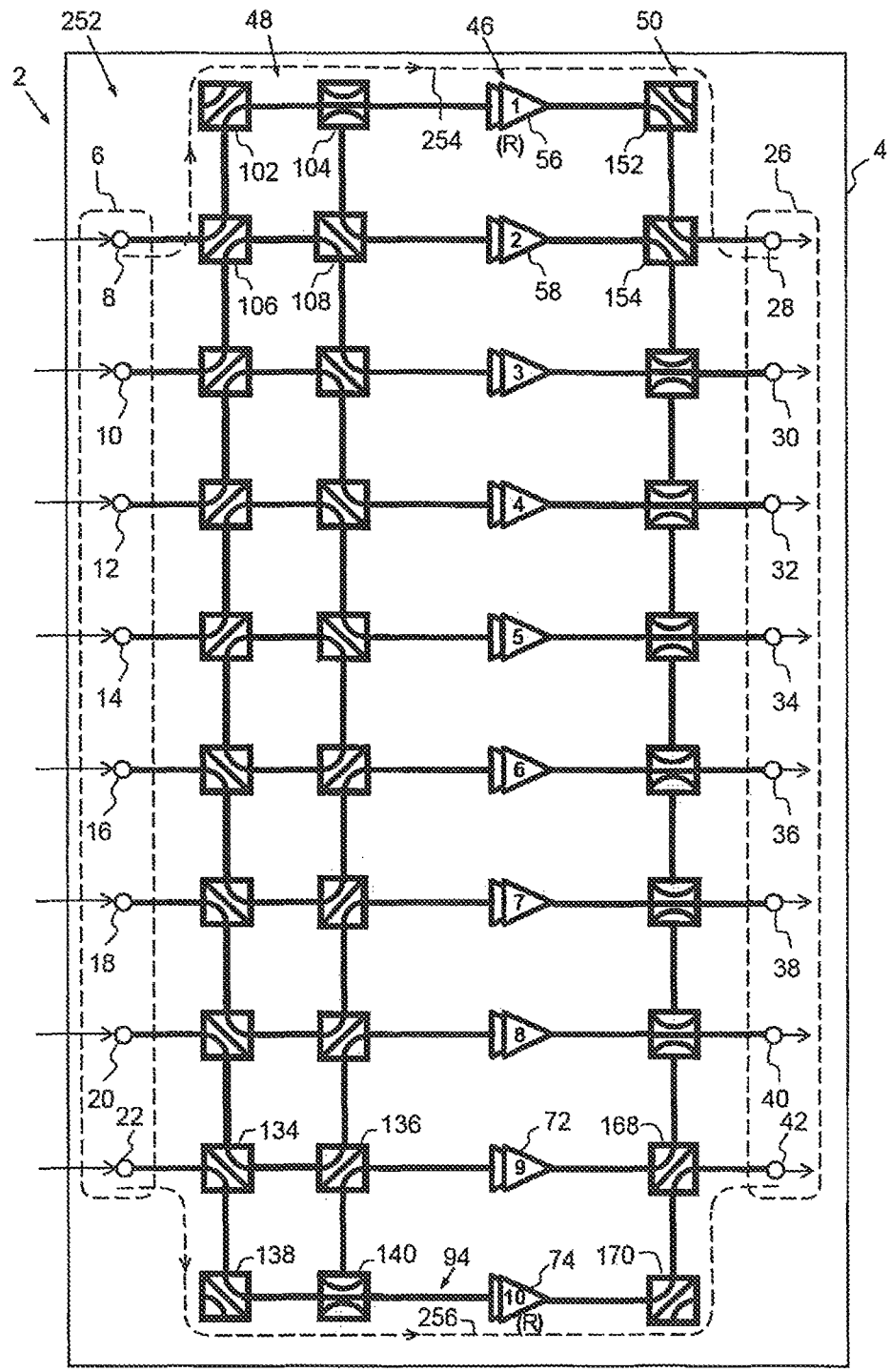
FIG. 6 is a view of a fourth back-up routing configuration of the distributed amplification device of FIG. 1 corresponding to a double failure, that of the amplifier of rank 2 and that of the amplifier of rank 9.

According to FIG. 6, a fourth back-up routing configuration 252 of the distributed amplification device of FIG. 1 remedies a double failure, that of the nominal amplifier 58 of rank 2 and that of the nominal amplifier 72 of rank 9.

The paths of the fourth back-up routing configuration 252 are identical to those of the nominal routing configuration 172 except for the first and eighth nominal paths 182, 196 which are replaced respectively by the first and eighth back-up paths 254 and 256, specific to the fourth back-up configuration 252.

The first back-up path 254 starts from the input terminal 8 of the first port 6, then passes in succession through the input switches 106, 102, 104, the back-up amplifier 56, the output switches 152, 154 and reaches the output terminal 28 of the second port 26.

The eighth back-up path 256 starts from the input terminal 22 of the first port 6, then passes in succession through the input switches 134, 138, 140, the back-up amplifier 74, the output switches 170, 168 and reaches the output terminal 42 of the second port 26.

The electrical lengths of all the paths of this fourth back-up routing configuration 252 are equal to one another and even equal to the common electrical length of the paths of the nominal configuration 172.

Similarly, independently of all the paths of the fifth back-up routing configuration chosen 252, the rotary switches of one and the same path are passed through globally in the same way in terms of the number of rotary switches passed through of one and the same path, here five switches, and of the numerical distribution of the switching configurations of the rotary switches activated in this path which here remains that of one first configuration, two second and two third configurations of a generic rotary switch 202.

Figure 7:
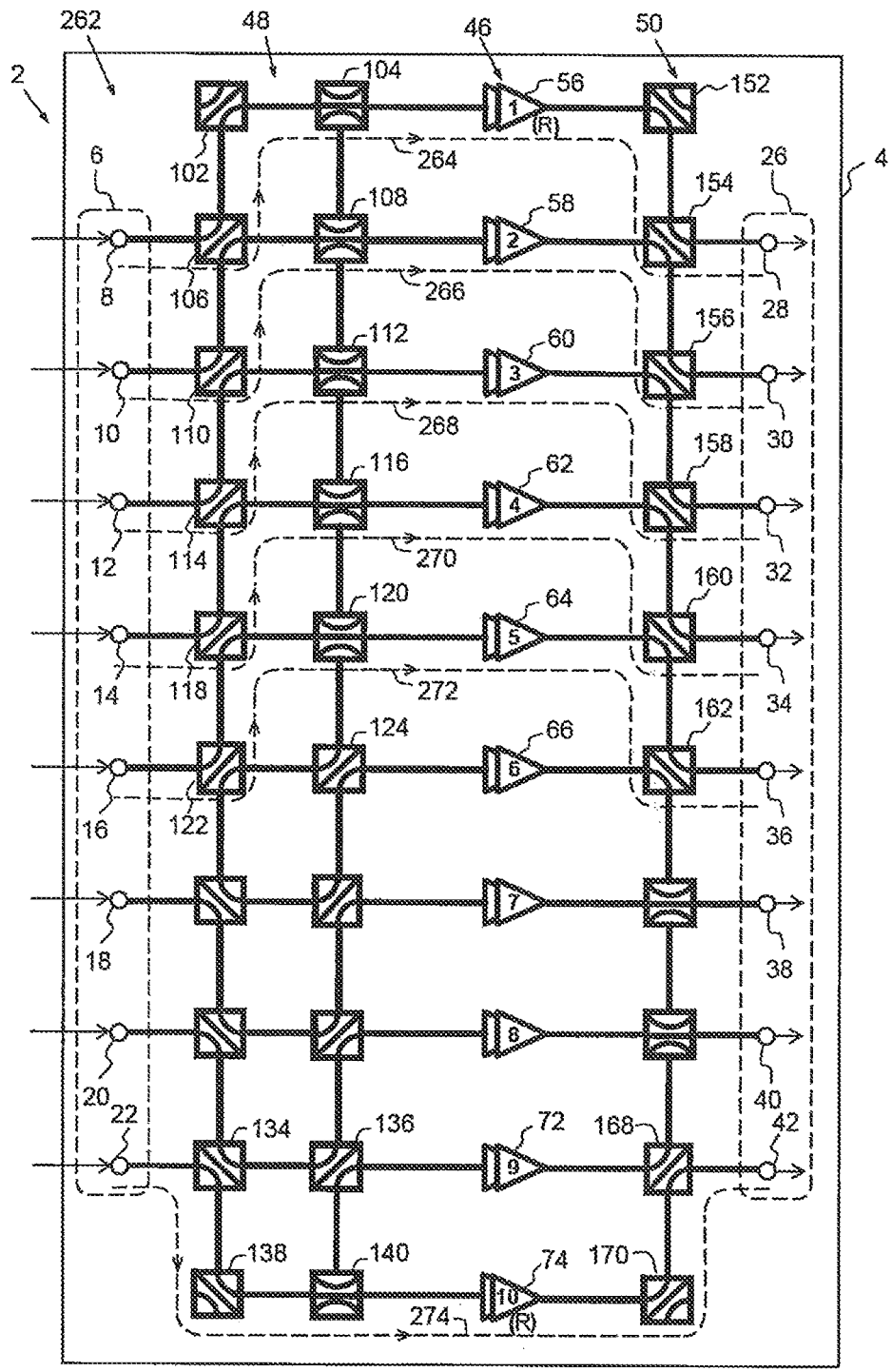
FIG. 7 is a view of a fifth back-up routing configuration of the distributed amplification device of FIG. 1 corresponding to a double failure, that of the amplifier of rank 6 and that of the amplifier of rank 9.

According to FIG. 7, a fifth back-up routing configuration 262 of the distributed amplification device of FIG. 1 remedies a double failure, that of the nominal amplifier 66 of rank 6 and that of the nominal amplifier 72 of rank 9.

The paths of the fifth back-up routing configuration 262 are identical to those of the nominal routing configuration 172 except for the first, second, third, fourth, fifth and eighth nominal paths 182, 184, 186, 188, 190, 196 which are replaced respectively by the first, second, third, fourth, fifth and eighth back-up paths 264, 266, 268, 270, 272 and 274 specific to the fifth back-up configuration 262.

The first back-up path 264 starts from the input terminal 8 of the first port 6, then passes in succession through the input switches 106, 102, 104, the back-up amplifier 56, the output switches 152, 154 and reaches the output terminal 28 of the second port 26.

The second back-up path 266 starts from the input terminal 10 of the first port 6, then passes in succession through the input switches 110, 106, 108, the amplifier 58, the output switches 154, 156 and reaches the output terminal 30 of the second port 26.

The third back-up path 268 starts from the input terminal 12 of the first port 6, then passes in succession through the input switches 114, 110, 112, the nominal amplifier 60, the output switches 156, 158 and reaches the output terminal 32 of the second port 26.

The fourth back-up path 270 starts from the input terminal 14 of the first port 6, then passes in succession through the input switches 118, 114, 116, the nominal amplifier 62, the output switches 158, 160 and reaches the output terminal 34 of the second port 26.

The fifth back-up path 272 starts from the input terminal 16 of the first port 6, then passes in succession through the input switches 122, 118, 120, the nominal amplifier 64, the output switches 160, 162 and reaches the output terminal 36 of the second port 26.

The eighth back-up path 274 starts from the input terminal 22 of the first port 6, then passes in succession through the input switches 134, 138, 140, the back-up amplifier 74, the output switches 170, 168 and reaches the output terminal 42 of the second port 26.

The electrical lengths of all the paths of this fifth back-up routing configuration 262 are equal to one another and even equal to the common electrical length of the paths of the nominal configuration 192.

According to the architecture of the distributed amplification reservoir common to that described in FIGS. 1 to 7, there is thus, in the case of one or two failures of any amplifier out of the ten amplifiers of the reservoir 2, a routing, implemented by the redundancy rings, which allows for a distributed amplification over eight active amplifiers, and for which the electrical lengths of the amplification paths are equal. This architecture even makes it possible to have a routing family that makes it possible to use the reservoir at full power with at most two failures on any one or two amplifiers of the reservoir and makes possible the preservation of one and the same length of the amplification paths independent of the routing configurations of the family of the routing configurations chosen.

The input and output redundancy rings 48, 50, used in the first embodiment of the distributed amplification device 2, are configured to complementarily compensate for the variations of electrical length of the active amplification paths modified upon a routing reconfiguration of the reservoir by covering a set of chosen routing configurations, described partially in FIGS. 1 to 7, which guarantee that all the nominal and redundant paths have electrical lengths equal to one another regardless of the frequency within one and the same configuration or of all chosen routing configurations.

Generally, a distributed amplification device, intended for a communications payload of a satellite, comprises a distributed amplification reservoir for amplifying a first plurality of a first integer number p greater than or equal to 2 of radiofrequency RF input signals, received by a first input port of input terminals mutually identical to within a phase and mutually phase-shifted according to a predetermined phase law, into a second plurality of p amplified RF signals supplied by a second output port of output terminals, associated respectively with the input terminals of the first port according to the same order. The distributed amplification reservoir further comprises:

a set of a second integer number n, greater than p and less than or equal to 2p+1, of amplifiers arranged electrically in parallel and respectively defining internal amplification pathways, mutually insulated electromagnetically and equalized, and respectively numbered by a row index varying from 1 to the second integer number n, the set of the n amplifiers being composed of a first series of p nominal radiofrequency amplifiers and a second series of n-p back-up amplifiers, and an input redundancy ring, formed by a first array of four-pole rotary switches, and an output redundancy ring, formed by a second array of four-pole rotary switches, the input and output redundancy rings being connected respectively between the first input port and a third port of input terminals of the set of the n amplifiers and between a fourth port of output terminals of the set of the n amplifiers and the second output port, to implement a family of routing configurations including a nominal routing configuration which uses the p nominal amplifiers of the first series as active amplifiers, and one or more back-up routing configurations, which each use at least one of the n-p back-up amplifiers out of the p active amplifiers selected from the set of the n amplifiers.

The input and output redundancy rings share the same technology.

The internal amplification pathways associated with the n-p back-up amplifiers completely surround or embrace in an interlaced manner the internal amplification pathways associated with the p nominal amplifiers.

The input and output redundancy rings are topologically and geometrically configured such that each routing configuration of the family includes a set of p independent distributed amplification paths, each amplification path individually including an input terminal of the first port, the output terminal of the second port associated with the input terminal of the first, an active amplifier and its row number, first passive links connected in series and passing through at least three rotary switches of the input redundancy ring and linking the input terminal of the first port to the input terminal of the active amplifier, and second passive links connected in series and passing through at least one switch of the output redundancy ring and linking the output terminal of the active amplifier to the output terminal of the second port, and the electrical lengths of all the paths of one and the same routing configuration of the second family are equal.

Each amplification path passes through a total number of rotary switches greater than or equal to five.

The input and output redundancy rings are topologically and geometrically configured and the family of the routing configurations is chosen such that the electrical lengths of all the paths of one and the same routing configuration of the family are equal.

In particular, the input and output redundancy rings are topologically and geometrically configured and the family of the routing configurations is chosen such that the electrical lengths of all the paths of all the family are equal.

Figure 8:
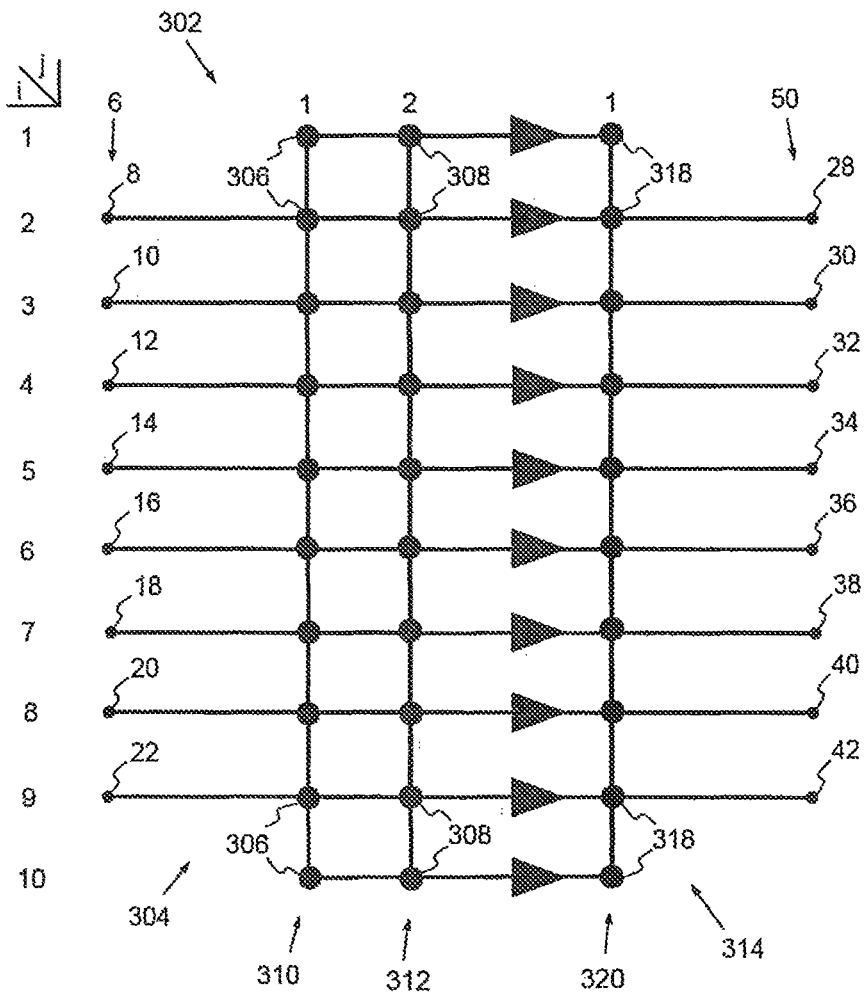
FIG. 8 is a matrix representation of the input and output redundancy rings of the first embodiment of the distributed amplification device according to the invention of FIG. 1.

According to FIG. 8, a matrix representation 302 of the input and output redundancy rings 48, 50 of the first embodiment of a distributed amplification device according to the invention of FIG. 1 is illustrated.

The first array of the interconnected switches of the input redundancy ring 48 is arranged according to a first matrix 304 of which the elements are the input four-pole rotary switches and form first nodes 306, 308, arranged here in two columns 310, 312 and ten rows, the ten rows corresponding to the rows of the internal amplification pathways 76, 78, 80, 82, 84, 86, 88, 90, 92, 94 of FIG. 1.

Eight first upstream end nominal nodes, taken from the first nodes 306 of the first column 310 forming a first upstream end column, are connected to the input terminals 8, 10, 12, 14, 16, 18, 20, 22 of the first port 6 and numbered according to a row index i1 varying from 2 to 9.

The first ten nodes 308 of the second column 312 forming a first downstream end column, taken as first downstream end nodes, are connected respectively one by one to the input terminals of the ten amplifiers and are numbered according to the row index i1 varying from 1 to 10.

The second array of the interconnected switches of the output redundancy ring 50 is arranged according to a second matrix 314 of which the elements are the output four-pole rotary switches and form second nodes 318, arranged in a single output column 320 with ten rows, the ten rows corresponding to the rows of the internal amplification pathways with the same numbering according to the row index varying from 1 to 10.

Eight second downstream end nominal nodes, taken from the second nodes 318 of the output column 320 forming a second downstream end column, are connected downstream to the output terminals 28, 30, 32, 34, 36, 38, 40, 42 of the second port 50 and are numbered by the row index i1 varying from 2 to 9.

The ten second nodes 318 of the output column 320, forming an upstream end column, are connected upstream to the output terminals of the amplifiers.

Figure 9:
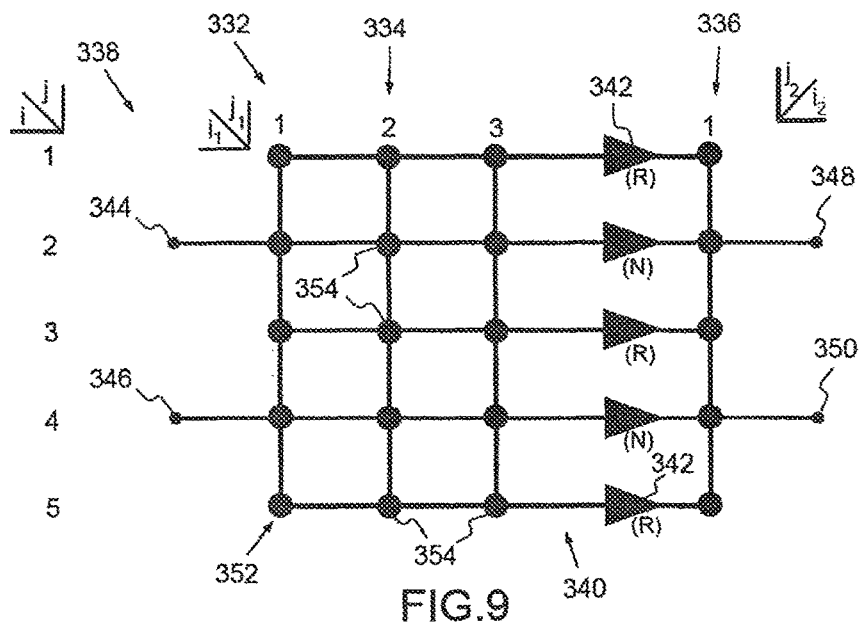
FIG. 9 is a matrix representation of the input and output redundancy rings of a second embodiment of a distributed amplification device with 5 amplifiers with two reservoir inputs and two reservoir outputs with a redundancy of 3 back-up amplifiers for two nominal amplifiers (p equal to 2 and r equal to 3)
Figure 10:
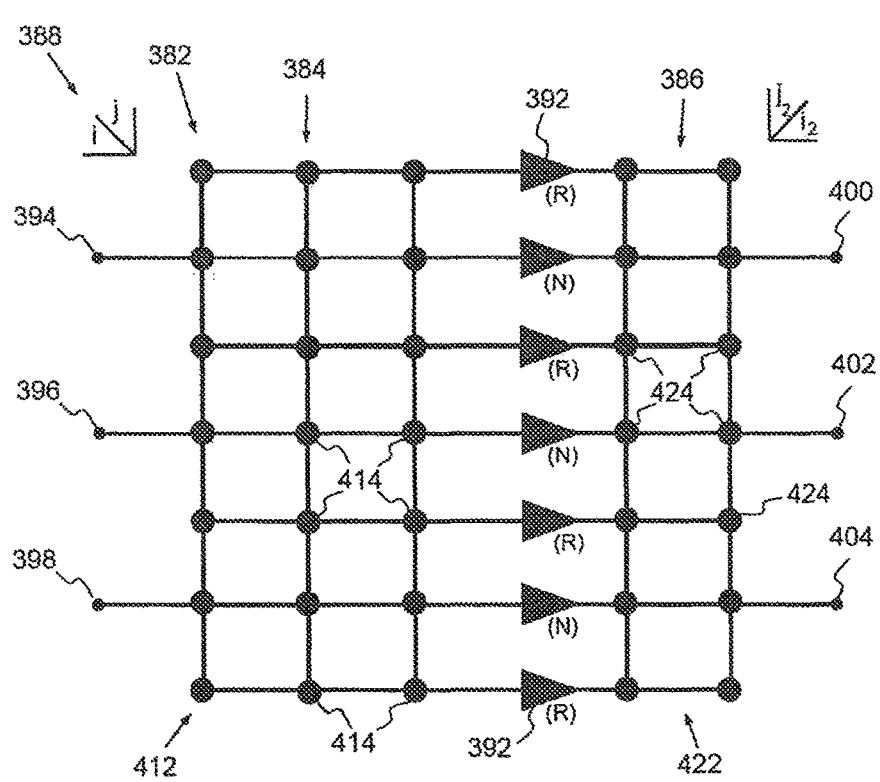
FIG. 10 is a matrix representation of the input and output redundancy rings of a third embodiment of a distributed amplification device with 7 amplifiers with three reservoir inputs and three reservoir outputs with a redundancy of four back-up amplifiers for three nominal amplifiers (p equal to 3 and r equal to 4)

This representation can be generalized, for example according to FIGS. 9 and 10, to distributed amplification devices having different $n$ and $p$ values and in which the number of columns of the input redundancy ring is greater than or equal to 3 and/or the number of columns of the output redundancy ring is greater than or equal to 2.

Generally, the first array of the interconnected switches of the input redundancy ring is arranged according to a first matrix of which the elements are the input four-pole rotary switches and form first nodes arranged in at least two columns and $\underline{n}$ rows, the rows corresponding to the rows of the internal amplification pathways.

p first upstream end nodes of a first upstream end column are connected to the input terminals of the first port, and n first downstream end nodes of a first downstream end column are connected respectively one by one to the input terminal of the $\underline{n}$ amplifiers.

The second array of the interconnected switches of the output redundancy ring is arranged according to a second matrix of which the elements are the output rotary switches and form second nodes arranged in at least one column and n rows, the n rows corresponding to the rows of the internal amplification pathways with the same numbering.

When the second matrix comprises at least two second columns, the second downstream end nominal nodes of a second downstream end column are connected to the output terminal of the second port and $\underline{n}$ second upstream end nodes of a second upstream end column are connected upstream respectively to the output terminals of the amplifiers according to one and the same row rank $\underline{i}$.

When the second matrix comprises a single second column, p second downstream and upstream end nodes of a single second end column are connected downstream to the output terminals of the second port and connected upstream respectively to the output terminals of the nominal amplifiers according to one and the same rank i, and r second remaining upstream end nodes are connected upstream respectively to the output terminals of the amplifiers.

Different redundancy ring configurations can be proposed and represented according to the above matrix representation according to the redundancy scheme that is desired for the device such as, for example, the schemes 11:8; 12:8; and 6:4.

According to FIG. 9, a matrix representation 332 of the input and output redundancy rings 334, 336 of a second embodiment of a distributed amplification device 338 of 5:2 redundancy is illustrated.

The distributed amplification device 338 includes a distributed amplification reservoir 340 which comprises a set of five amplifiers 342 including three back-up amplifiers, two input terminals 344, 346 of first port and two output terminals 348, 350 of second port.

A first matrix 352 representing the input redundancy ring 334 is a matrix of first nodes 354 with five rows, identified by a row index i1 varying from 1 to 5 from top to bottom in FIG. 9, and three columns, identified by a column index j1 varying from 1 to 3.

The first upstream end nodes of the second (i1=2) and fourth (i1=4) rows are respectively connected to a single and different input terminal 344, 346. The first downstream end nodes of the second (i1=2) and fourth (i1=4) rows are respectively connected to the input terminal of a single and different nominal amplifier.

A second matrix 362 representing the output redundancy ring is a matrix of second nodes 364 with five rows, identified by a row index i2 varying from 1 to 5 from top to bottom in FIG. 9, and a single column, identified by a column index j2 equal to 1.

The second end nodes of the second (i2=2) and fourth (i2=4) rows are respectively connected downstream to a single and different output terminal 348, 350. The second end nodes of the second (i2=2) and fourth (i2=4) rows are respectively connected to the output terminal of the nominal amplifier having the same row index.

The architecture proposed in the second embodiment 338 makes it possible to have balanced routing configurations over the entire frequency band and on all the paths in all the possible failure scenarios ranging from a single failure to a triple failure.

According to FIGS. 9 and 10, the second series of the n-p back-up amplifiers is formed by at least three back-up amplifiers, and the internal amplification pathways associated respectively with the back-up amplifiers surround in an interlaced manner the internal amplification pathways associated respectively with the nominal amplifiers.

According to FIG. 10, a matrix representation 382 of the input and output redundancy rings 384, 386 of a third embodiment of a distributed amplification device 388 of 7:3 redundancy is illustrated.

The distributed amplification device 388 includes the distributed amplification reservoir 390 which comprises a set of seven amplifiers 392 including four back-up amplifiers (.R.), three input terminals 394, 396, 398 of first port and three output terminals 400, 402, 404 of second port.

A first matrix 412 representing the input redundancy ring is a matrix of first nodes 414 with seven rows, identified by a row index i1 varying from 1 to 7 from top to bottom in FIG. 10, and three columns, identified by a column index j1 varying from 1 to 3.

The first upstream end nodes of the second (i1=2), fourth (i1=4), and sixth (i1=6) rows are respectively connected to a single and different input terminal 394, 396, 398. The first downstream end nodes of the second (i1=2), fourth (i1=4), sixth (i1=6) rows are respectively connected to the input terminal of a single and different nominal amplifier (N).

A second matrix 422 representing the output redundancy ring 386 is a matrix of second nodes 424 with seven rows, identified by a row index i2 varying from 1 to 7 from top to bottom in FIG. 10, and with two columns, identified by a column index j2 varying from 1 to 2 from left to right in FIG. 10.

The second downstream end nodes of the second downstream end column (second column of the output redundancy ring furthest to the right in FIG. 10) of the second (i2=2), fourth (i2=4), sixth (i2=6) rows are respectively connected downstream to a single and different output terminal 400, 402, 404. The second end nodes of the second (i2=2), fourth (i2=4), sixth (i2=6) rows of the second upstream end column (first column of the output redundancy ring furthest to the left in FIG. 10) are respectively connected to the output terminal of the nominal amplifier having the same row index.

The architecture proposed in the third embodiment 388 makes it possible to have routing configurations that are balanced over the entire frequency band and on all the paths in all the possible failure scenarios ranging from a single failure to a quadruple failure.

It should be noted that although the invention can be applied to any total number of amplifiers forming the reservoir and with any redundancy ratio (n/(n−p)), an excessive increase in the number n−p will of course result in correcting a multiplicity of failures but with an increasingly high number of switches, and a complexity, a weight and even radiofrequency losses that are prohibitive.

When n is equal to 2p+1, the number of columns of the redundancy rings becomes inflated as shown in FIGS. 9 and 10.

However, when n is less than or equal to 2p, the inflation of the number of columns ceases and reservoir architectures will be preferred that use two or three columns for the input redundancy ring and a single column for the output ring.

Figure 11:
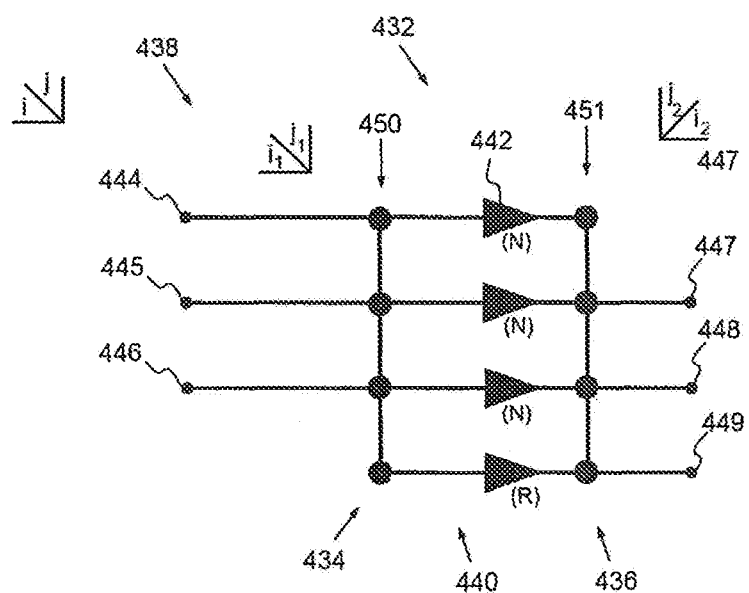
FIG. 11 is a matrix representation of the input and output redundancy rings of a fourth embodiment of a distributed amplification device with 4 amplifiers with three reservoir inputs and three reservoir outputs with a redundancy of four back-up amplifiers for three nominal amplifiers (p equal to 3 and r equal to 1).

According to FIG. 11, a matrix representation 432 of the input and output redundancy rings 434, 436 of a fourth embodiment of a distributed amplification device 438 of 4:3 redundancy is illustrated.

The distributed amplification device 438 includes the distributed amplification reservoir 440 which comprises a set of four amplifiers 442 including a back-up amplifier (R), three input terminals 444, 445, 446 of first port and three output terminals 447, 448, 449 of second port.

A first matrix 450 representing the input redundancy ring is a single-column matrix of first nodes with four rows, identified by a row index i1 varying from 1 to 4 from top to bottom in FIG. 11.

The first nodes of the first (i1=1), second (i1=2), third (i1=3) rows are respectively connected upstream to an input terminal of single and different first port, the first node of the fourth row (i1=4) not being connected directly to any input terminal of the first port.

The first nodes of the first (i1=1), second (i1=2), third (i1=3) rows are connected respectively downstream to the input terminal of a single and different nominal amplifier (N).

A second matrix 451 representing the output redundancy ring is a single-column matrix of second nodes with four rows, identified by a row index i2 varying from 1 to 4 from top to bottom in FIG. 11.

The second nodes of the second (i2=2), third (i2=3), fourth (i2=4) rows are respectively connected downstream to an output terminal of the second port, the second node of the first row (i2=1) not being connected directly to any output terminal of the second port. The second nodes of the second (i2=2), third (i2=3) rows are respectively connected to the output terminal of the nominal amplifier having the same row index whereas the second node of the fourth (i2=4) row is connected to the output of the back-up amplifier.

This configuration can be generalized to any number p of amplifiers to provide a distributed amplification device of p+1:p redundancy.

Figure 12:
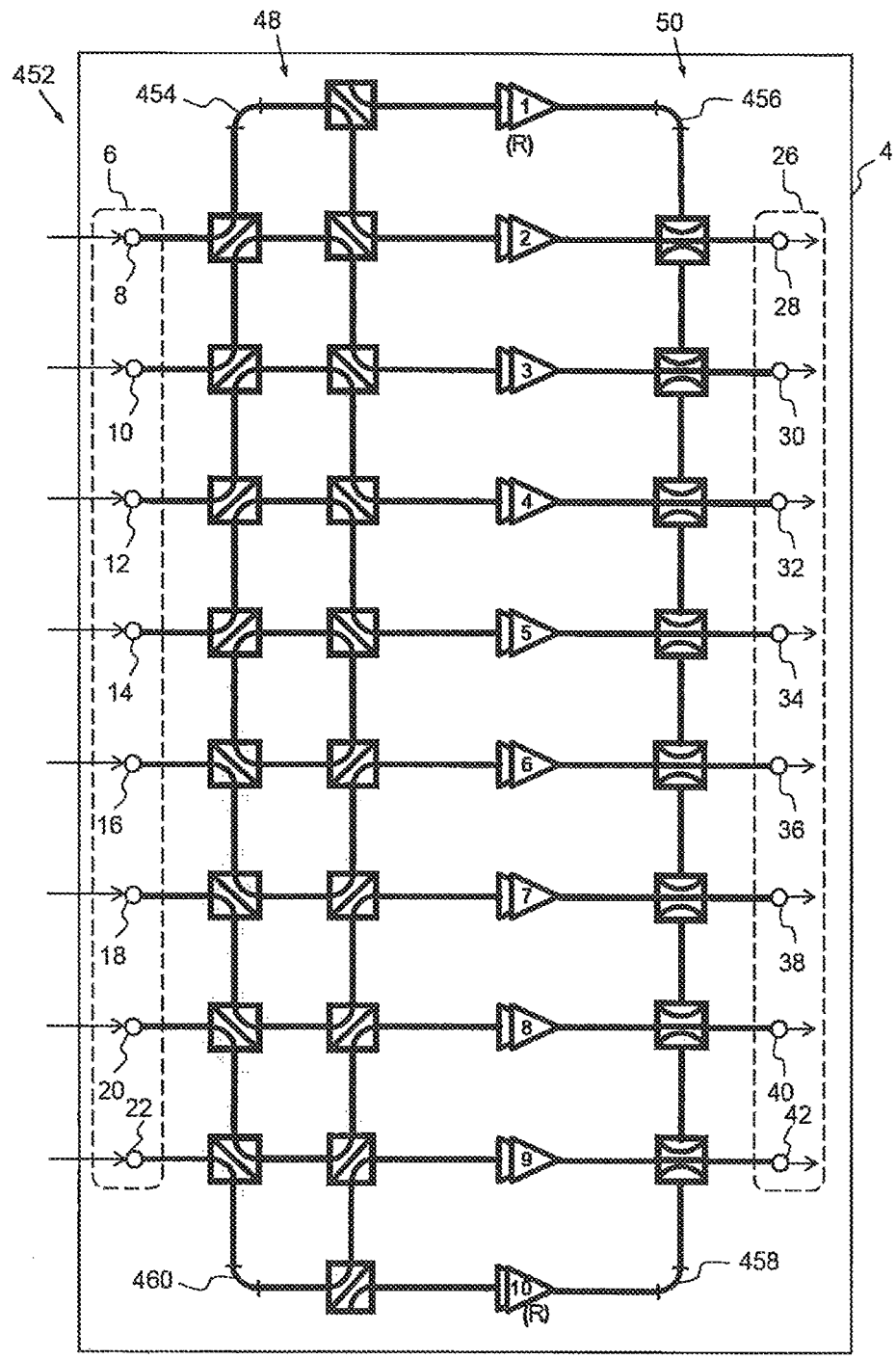
FIG. 12 is a view of a fifth embodiment of a distributed amplification device according to the invention, derived from the first embodiment of FIGS. 1 to 8.

According to FIG. 12, a fifth embodiment of a distributed amplification device 452 is derived from the distributed amplification device 2 of FIGS. 1, 2 to 7 and differs therefrom in that the four "corner" switches 102, 152, 138, 140 are replaced by passive electrical links 454, 456, 458, 460 respectively having the same electrical length as that of the corresponding switch.

Thus, the passive link 454 and the passive link 458 respectively have the electrical length of the link interconnecting the fourth pole and the third pole and the electrical length of the link interconnecting the first pole and the second pole of a generic four-pole rotary switch 202 when it is in the third switching configuration described in FIG. 2C.

Concerning the passive link 456 and the passive link 460, they respectively have the electrical length of the link interconnecting the first pole and the fourth pole and the electrical length of the link interconnecting the second and the third pole of a generic four-pole rotary switch 202 when it is in the second switching configuration described in FIG. 2B.

Generally, at least one switch out of the switches of the first upstream end column of the input redundancy ring and the switches of the second upstream end column of the output redundancy ring is replaced by a link of the same electrical length.

Figure 13:
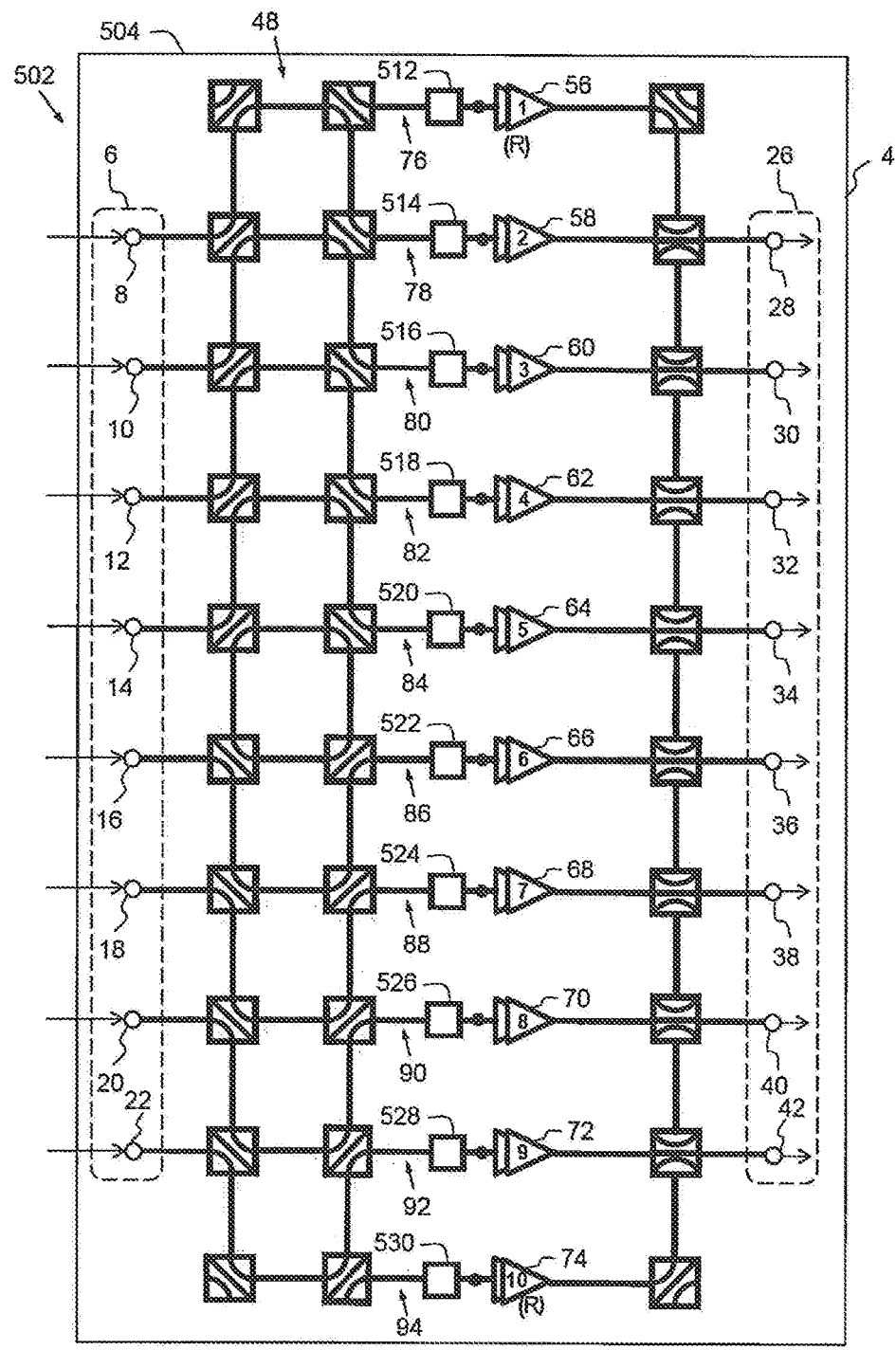
FIG. 13 is a view of a sixth embodiment of a distributed amplification device according to the invention, derived from the first embodiment of FIGS. 1 to 8 with means for balancing or equalizing the gain and phase of the distributed amplification paths.

According to FIG. 13, a sixth embodiment of a distributed amplification device 502 is derived from the distributed amplification device 2 of FIGS. 1, 2 to 7 and differs therefrom by the distributed amplification reservoir 504.

The distributed amplification reservoir 504 has the same structure as that of the distributed amplification reservoir 4 of FIG. 1 and differs therefrom by the addition of amplitude and phase setting means 512, 514, 516, 518, 520, 522, 524, 526, 528, 530 over a wideband, arranged respectively upstream of the power amplifiers 56, 58, 60, 62, 64, 66, 68, 70, 72, 174 and downstream of the input redundancy ring 48 on the internal amplification pathways 76, 78, 80, 82, 84, 86, 88, 90, 92 and 94.

Generally, amplitude and phase setting means are arranged upstream and/or downstream of each amplifier between the input and output redundancy rings, preferably upstream when the amplifiers are power amplifiers and preferably downstream when the amplifiers are low-noise amplifiers.

According to FIG. 13, the amplitude and phase setting means 512, 514, 516, 518, 520, 522, 524, 526, 528, 530 are configured to balance all the distributed internal amplification paths of the operating configurations provided for the reservoir in a wide frequency band by including therein the disparities in propagation over the entire band of the amplifiers which are not here necessarily mutually balanced.

Figure 14:
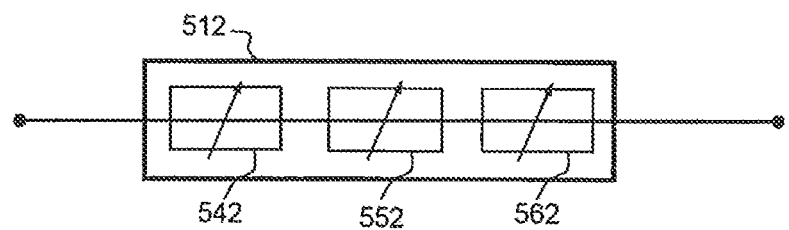
FIG. 14 is a view of the setting means of an internal distributed amplification pathway of the fifth embodiment of FIG. 12.

According to FIGS. 13 and 14, the amplitude and phase setting means of each distributed internal amplification path, for example the amplitude and phase setting means 512, generically comprise an amplitude attenuator 542, a first phase-shifter 552 and a second phase-shifter 562, each of these three elements being able to be set separately.

The first phase-shifter 552 is a phase-shifter of the "electrical length" type included in the set formed by the "phase trimmers" for which the phase-shift varies as a function of the frequency. These are generally mechanical phase-shifters which are widely used in coaxial or waveguide technologies.

The second phase-shifter 562 is a phase-shifter of the "constant" type with phase-shift that is constant over the entire wideband of frequencies included in the diodes for low-power uses and the ferrites for high-power uses.

The settings of the first phase-shifter 552 and/or of the second phase-shifter 562 can be set once and for all or can be reconfigurable by remote control.

According to FIG. 14, and generally, the amplitude attenuators 542, the first phase-shifters 552 and the second phase-shifters 562 of the amplitude and phase setting means 512, 514, 516, 518, 520, 522, 524, 526, 528, 530 are configured respectively through their adjustments to balance the gains of the amplifiers over the wide frequency band, bring close together the variations of phase as a function of the frequency over a wide frequency band of all the distributed internal amplification paths, including the amplifiers, of the operating configurations provided for the reservoir, and compensate for the dispersions of the constant phase offsets introduced by the active amplifiers in all the distributed internal amplification paths of the operating configurations provided for the reservoir.

It should be noted that the association of a first phase-shifter and of a second phase-shifter on each of the internal pathways is necessary to balance the internal pathways in wide frequency bands.

Figure 15A:
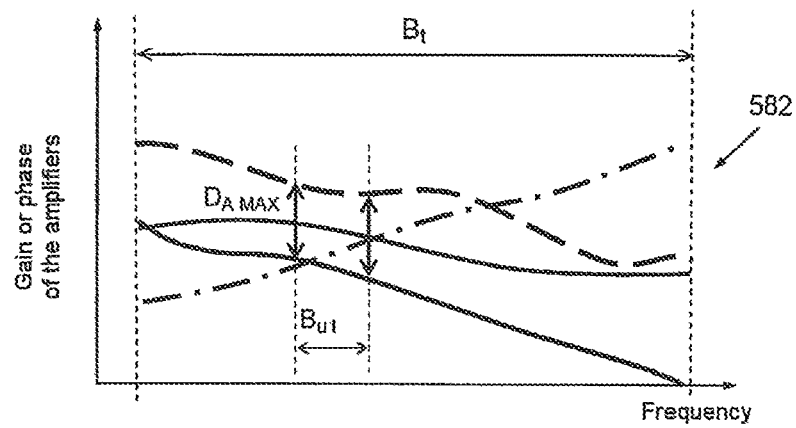
FIGS. 15A, 15B, 15C and 15D are views of the gain and phase dispersions of the distributed amplification paths of a conventional distributed amplification device over eight active amplifiers (p=8) with two back-up amplifiers (n−p=2) corresponding respectively to a first case of a device without equalization of the electrical lengths of the routing paths and without gain and phase setting means, a second case of a device without equalization of the electrical lengths of the routing paths and with gain and phase setting means on a predetermined frequency, a third case of a device with equalization of the electrical lengths of the routing paths within one and the same configuration and provided with gain and phase setting means on a predetermined frequency, and a fourth case of a device with equalization of the electrical lengths of the routing paths of one and the same configuration and with gain and phase setting means over a frequency band.

According to FIG. 15A the gain and phase dispersions of the distributed amplification paths of a conventional distributed amplification device over eight active amplifiers, that is to say p equal to 8, with two back-up amplifiers, that is to say n−p equal to 2, are illustrated as a function of the frequency over a fixed wideband Bt.

The conventional distributed amplification device uses a conventional input and output redundancy ring architecture, that is to say without compensation in terms of electrical length between the input ring and the output ring on the amplification paths of a routing configuration within the reservoir and without gain and phase setting means on a predetermined frequency.

The maximum acceptable gain and/or phase dispersion in the band between the paths used at each frequency is set and designated by $D_{Amax}$, and the maximum useful transmission band of frequencies for which the gain and/or phase dispersion for each frequency in the band is less than or equal to Da is denoted Bu1.

It appears that the maximum useful transmission band Bu1 corresponding to a conventional redundant device architecture without compensation within complementary rings and means for setting to a predetermined frequency is narrower than the wideband Bt that is desired.

Figure 15B:
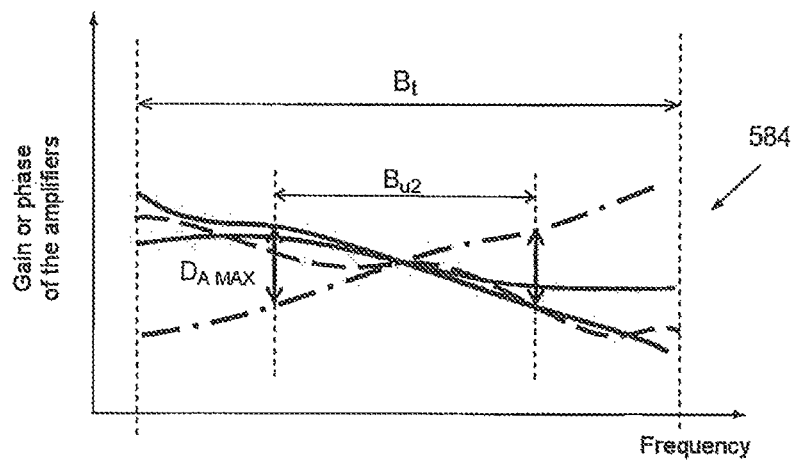

According to FIG. 15B, the gain and phase dispersions over a wideband of the distributed amplification paths of a conventional distributed amplification device in which the amplification responses of the amplification paths have been equalized only using gain and phase setting means on a predetermined frequency, are illustrated as a function of the frequency over a given wideband Bt.

The maximum acceptable gain and/or phase dispersion between the paths used at each frequency is set to the same value $D_{Amax}$ as that of FIG. 15A and the maximum useful transmission frequency band for which the gain and/or phase dispersion is less than or equal to $D_{Amax}$ is denoted Bu2.

Despite a widening of the band Bu2 compared to the band Bu1 because of the use of gain and setting means on a predetermined frequency, the band Bu2 is nevertheless narrower than the wide band Bt that is desired.

Figure 15C:
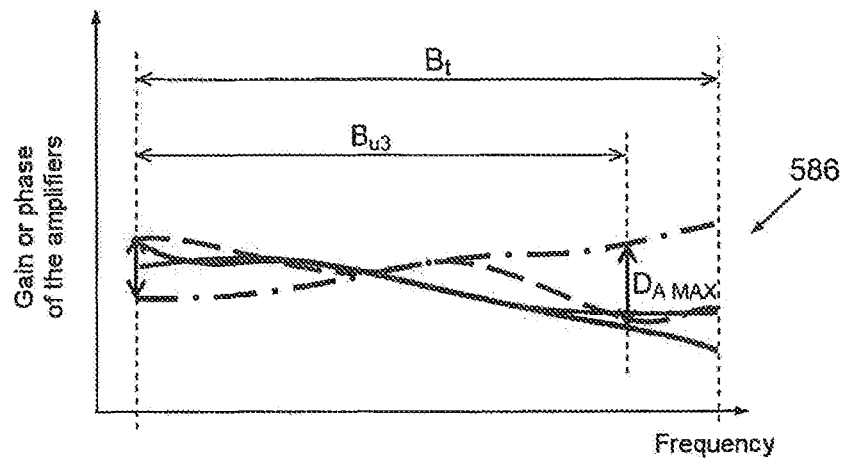

According to FIG. 15C, the gain and/or phase dispersions over a wideband of the distributed amplification paths of a distributed amplification device according to the invention of FIG. 1, in which there is a compensation in terms of electrical length between the input ring and the output ring on the amplification paths modified within each routing configuration within the reservoir, and there are wideband gain and phase setting means for each amplification path, are illustrated as a function of the frequency over a fixed wideband Bt.

The acceptable gain and/or phase dispersion between the paths used at each frequency is set to the same value $D_{Amax}$ as that of FIG. 15A and the maximum useful transmission frequency band for which the gain and/or phase dispersion is less than or equal to $D_{Amax}$ is denoted Bu3.

It appears that the band Bu3 is as wide as the wideband Bt and thus that the first embodiment of the distributed amplification device is compatible with a wideband operation as sought.

Figure 15D:
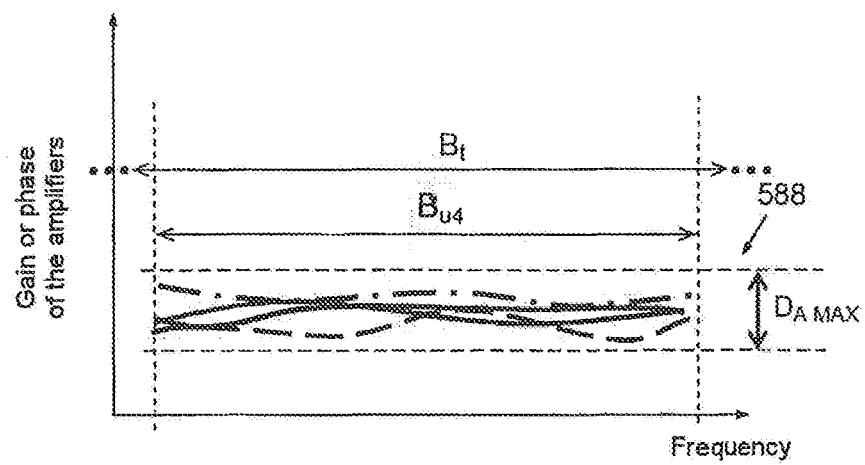

According to FIG. 15D, the gain and phase dispersions over the entire band of the distributed amplification paths of a distributed amplification device according to the fourth embodiment of FIG. 12, in which, in addition to the internal compensation of the input and output redundancy rings, an additional equalization of the amplification responses of the routing paths is implemented by gain and phase setting means over a band of frequencies, are illustrated as a function of the frequency over a wideband larger than the wideband Bt.

The acceptable gain and/or phase dispersion between the paths used at each frequency in the band is set to the same value $D_{Amax}$ as that of FIG. 15A and the maximum useful transmission frequency band for which the gain and/or phase dispersion is less than or equal to $D_{Amax}$ is denoted Bu4.

It appears that the band Bu4 is wider than wideband Bu3 and thus that the fourth embodiment of the distributed amplification device is compatible with a wideband operation as sought, and even improves on that obtained with the first embodiment.

Thus, the architectures of the various embodiments of the invention illustrated in FIGS. 1, 3 to 13 allow for an operation compatible with a wideband used. Notably, the various embodiments will make it possible to cover the entire Ku band, that is to say a 2 GHz wideband with a central frequency substantially equal to 11.7 GHz, and to offer a total flexibility in the frequency plane allocated to the coverages using the distributed amplification.

Figure 16:
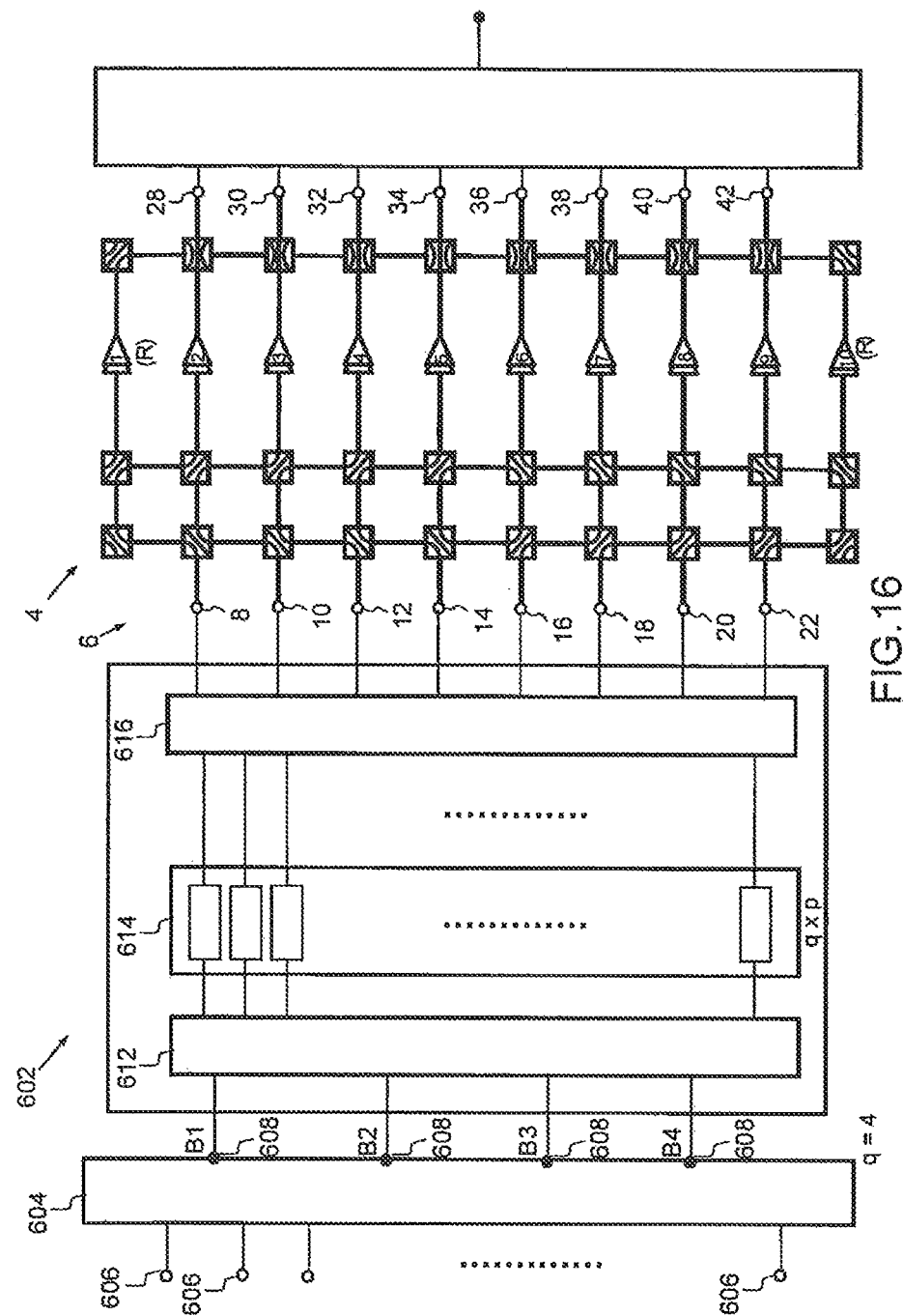
FIG. 16 is a view of a seventh embodiment of a distributed amplification device according to the invention, derived from the first embodiment of FIGS. 1 to 8 with means for grouping together communication channels in frequency bands upstream of the distributed amplification reservoir.

According to FIG. 16 and a seventh embodiment of a distributed amplification device 602 according to the invention, derived from the first embodiment 2 of FIGS. 1 to 7 and from the distributed amplification device with combination of signals over four frequency bands, described in the patent application WO 2008/017699 A1, the distributed amplification device 602 comprises the distributed amplification reservoir 4 of FIG. 1 and means for grouping together communication channels 604 in frequency bands, said grouping means 604 being arranged upstream of the distributed amplification reservoir 4.

The frequency band combination means comprise s inputs 606 for receiving s communications channels and q outputs 608 for respectively providing channels grouped together within q frequency bands in q frequency band signals. Here, q is taken for example to be equal to four and the s communication channels are grouped together within four adjacent frequency bands, designated B1, B2, B3, B4 and forming, juxtaposed, a wide frequency band, in four frequency band signals.

The distributed amplification device 602 also comprises a set of dividers 612 for dividing up the power of the q band signals (q=4) over the p inputs (p=8) of the input port 6 of the distributed amplification reservoir 4, and gain and phase setting means 614 corresponding to the p (p=8) amplifiers over the q (q=4) frequency bands, and means for summing 616, over a wideband, the p*q signals, divided in bands and in powers, in wideband signals of divided power.

The gain and phase setting means 614 comprise p times q phase-shifters and attenuators arranged within the set of dividers and are here setting means of wideband type like those described in FIG. 14.

As a variant, the gain and phase setting means are setting means over a single frequency per frequency band.

Figure 17:
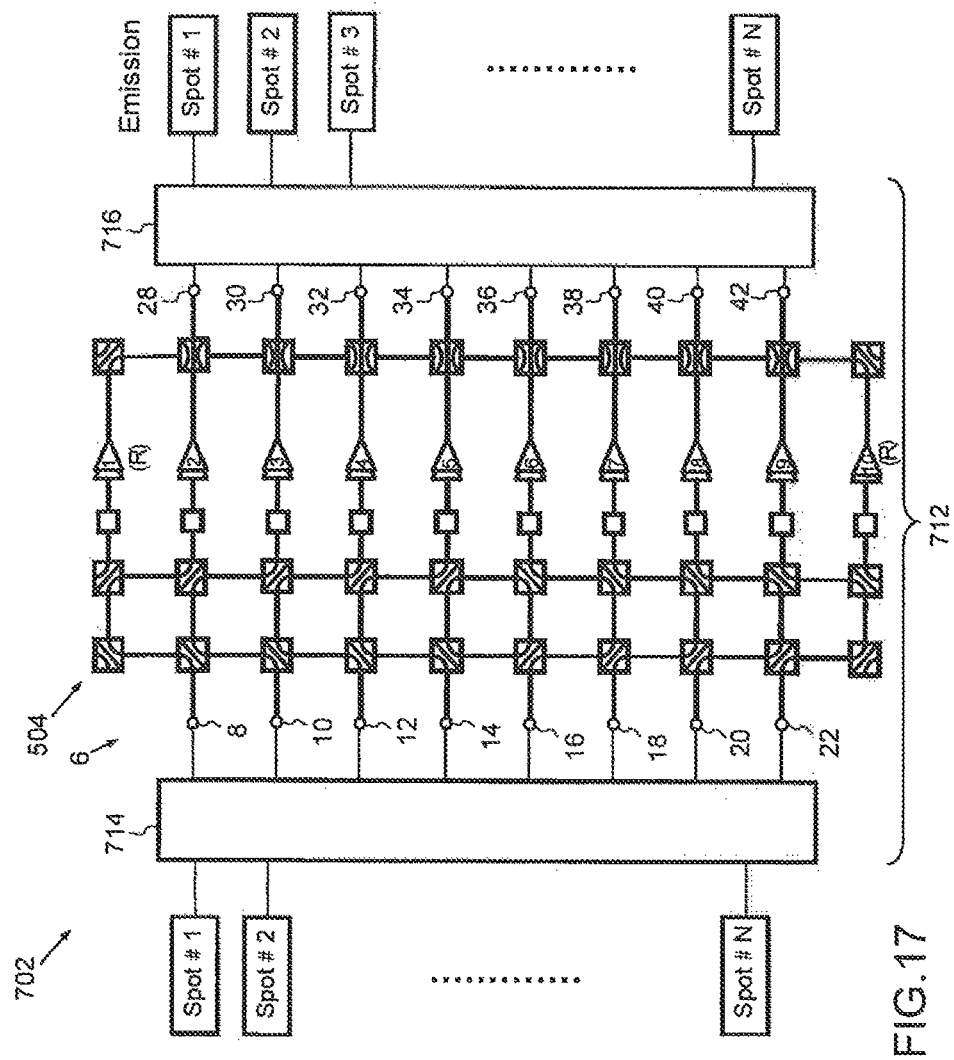
FIG. 17 is a view of a telecommunication payload, that can be reconfigured in real time according to the traffic in the beams, which uses a distributed amplification device forming a multiport power amplifier (MPA).

According to FIG. 17, a telecommunication payload 702, reconfigurable in real time as a function of the traffic in the beams, uses a distributed amplification device 712 forming a multiport power amplifier (MPA).

The MPA-forming distributed amplification device 712 comprises the distributed amplification reservoir 504, described in FIG. 12, with the additional feature that the amplifiers of the reservoir 504 are power amplifiers included in the set formed by the amplifiers using travelling wave tubes (TWTAs) and the solid state amplifiers (SSPAs).

The MPA-forming distributed amplification device 712 further comprises a network 714 for dividing the input powers of the signals supplied by a set of spots or reception beams on the input terminals 8, 10, 12, 14, 16, 18, 20, 22 of the input port 6, and a network 716 for combining the equally distributed output powers over the signals delivered at the output terminals 28, 30, 32, 34, 36, 38, 40, 42 of the output port 26 of the reservoir 504 into signals of input power distributed over a set of emission spots as a function of the traffic demand.

In a variant, the amplifiers of the distributed amplification reservoir are low-noise solid state amplifiers and the distributed amplification device forms the reception stage of an active reception antenna.

Generally, the amplifiers of a reservoir as described above in FIGS. 1 to 13 are power amplifiers included in the set formed by the amplifiers using travelling wave tubes (TWTAs) and the solid state amplifiers (SSPAs).

In particular, at least one amplifier of the reservoir can be a set of at least two travelling wave tubes (TWTAs) associated in parallel or of at least two solid state amplifiers (SSPAs) associated in parallel.

The invention claimed is:

1. A distributed amplification device, intended for a communications payload of a satellite, comprising:
a distributed amplification reservoir for amplifying a first plurality of a first integer number p greater than or equal to 2 of radio frequency amplifier input signals, received by a first input port of input terminals, mutually identical to within a phase, into a second plurality of respective p amplified RF signals supplied by a second output port of output terminals, associated respectively with the input terminals of the first input port, the distributed amplification reservoir comprising:
a set of a second integer number n, greater than p and less than or equal to 2p+1, of amplifiers arranged electrically in parallel and respectively forming internal amplification pathways, mutually insulated electromagnetically and equalized, and respectively numbered by a row index varying from 1 to the second integer number n, the set of the n amplifiers being composed of a first series of p nominal radio frequency amplifiers and of a second series of n p back-up amplifiers,
an input redundancy ring, formed by a first array of four pole rotary switches, and an output redundancy ring, formed by a second array of four pole rotary switches,
the input and output redundancy rings being connected respectively between the first input port and a third port of input terminals of the set of the n amplifiers and between a fourth port of output terminals of the set of the n amplifiers and the second output port, to implement a family of routing configurations having a nominal routing configuration which uses the p nominal amplifiers of the first series as active amplifiers, and
one or more back-up routing configurations, which each use at least one of the n p back-up amplifiers out of the p active amplifiers selected from the set of the n amplifiers,
the distributed amplification device wherein:
the input and output redundancy rings use similar propagation conditions; and
the input and output redundancy rings are topologically and geometrically configured such that each routing configuration of the family comprises a set of p independent distributed amplification paths, each amplification path individually including an input terminal of the first port, the output terminal of the second port associated with the input terminal of the first, an active amplifier and its row number, first passive links connected in series and passing through at least three rotary switches of the input redundancy ring and linking the input terminal of the first port to the input terminal of the active amplifier, and second passive links connected in series and passing through at least one switch of the output redundancy ring and linking the output terminal of the active amplifier to the output terminal of the second port; and electrical lengths of all the paths of one and the same routing configuration of the family are equal.

2. The distributed amplification device according to claim 1, wherein the input and output redundancy rings are topologically and geometrically configured and the family of the routing configurations is chosen such that electrical lengths of all the paths of all the family are equal.

3. The distributed amplification device according to claim 1, wherein, upon a reconfiguration of a first routing configuration of the family to a second routing configuration of the family, the differences in electrical lengths deriving from the reconfiguration of the input ring are compensated by the reconfiguration of the output redundancy ring for each modified distributed amplification path.

4. The distributed amplification device according to claim 1, wherein same technology is shared by the input and output redundancy rings, and is included in the set formed by coaxial technology and waveguide technology.

5. The distributed amplification device according to claim 1, wherein
independently of all the paths of all the routing configurations of the family of the reservoir,
the rotary switches of one and the same amplification path are passed through globally in same way in terms of the number of rotary switches passed through of one and the same path and the numerical distribution of the switching configurations of the rotary switches activated in this path.

6. The distributed amplification device according to claim 1, wherein
the family of the routing configurations comprises a nominal routing configuration which uses the p nominal amplifiers of the first series as active amplifiers, and
one or more back-up routing configurations which each use at least one of the n p back-up amplifiers out of the p active amplifiers selected from the set of the n amplifiers;
the back-up routing configuration or configurations being determined to maintain a maximum amplification capacity of the reservoir in all failure cases of at most p amplifiers out of the set of the n amplifiers when p is less than or equal to n, and at most p+1 amplifiers out of the set of the n amplifiers when n is equal to 2p+1.

7. The distributed amplification device according to claim 1, wherein
the first array of the interconnected switches of the input redundancy ring is arranged according to a first matrix of which elements are the input four pole rotary switches and form first nodes arranged in at least two columns and n rows, the n rows corresponding to the n rows of the internal amplification pathways, p first upstream end nodes of a first upstream end column being connected to the p input terminals of the first port and n first downstream end nodes of a first downstream end column being connected respectively one by one to the input terminals of the n amplifiers; and
the second array of the interconnected switches of the output redundancy ring is arranged according to a second matrix of which the elements are the output rotary switches and form second nodes arranged in at least one column and n rows, the n rows corresponding to the rows of the n internal amplification pathways with the same numbering,
p second downstream end nominal nodes of a second downstream end column being connected to the p output terminals of the second port and n second upstream end nodes of a second upstream end column being connected upstream respectively to the output terminals of the amplifiers according to the same rank, when the second matrix comprises at least two second columns; or
p second downstream and upstream end nodes of a single second end column connected downstream to the output terminals of the second port and connected upstream respectively to the output terminals of the nominal amplifiers according to same rank, and n-p second remaining upstream end nodes connected upstream respectively to the output terminals of the amplifiers when the second matrix comprises a single second column.

8. The distributed amplification device according to claim 7, wherein at least one switch out of the switches of the first upstream end column and of the second upstream end column is replaced by a link of a same electrical length.

9. The distributed amplification device according to claim 7, wherein the first matrix comprises two or three columns and the second matrix comprises a single column.

10. The distributed amplification device according to claim 1, wherein
the distributed amplification reservoir comprises amplitude and phase setting means, arranged upstream and/or downstream of each amplifier between the input and output redundancy rings, preferably upstream when the amplifiers are power amplifiers and preferably downstream when the amplifiers are low noise amplifiers;
and the amplitude and phase setting means are configured to balance all the distributed internal amplification paths of operating configurations provided for the reservoir in a wide frequency band.

11. The distributed amplification device according to claim 10, wherein
the amplitude and phase setting means of each distributed internal amplification path comprise an amplitude attenuator, a first phase shifter and a second phase shifter,
the first phase shifter being a phase shifter of an electrical length type included in the set formed by phase trimmers, and the second phase shifter being a phase shifter with constant phase shift over the entire wide frequency band; and
the amplitude attenuators, the first phase shifters and the second phase shifters are configured respectively to balance the gains of the amplifiers over the wide frequency band,
bring close together the phase variations as a function of the frequency over a wide frequency band of all the distributed internal amplification paths of the operating configurations provided for the reservoir,
compensate for the dispersions of the constant phase offsets introduced by the active amplifiers of all the distributed internal amplification paths of the operating configurations provided for the reservoir.

12. The distributed amplification device according to claim 1, wherein the amplifiers of the reservoir are power amplifiers included in the set formed by the amplifiers using travelling wave tubes and the solid state amplifiers, and the distributed amplification device is a multiport power amplifier further comprising:
an input power equal distribution network over the input terminals of the input port; and
an output power distribution network.

13. The distributed amplification device according to claim 12, wherein the input power distribution network is a beam forming input network and the output power distribution network is an output forming network.

14. The distributed amplification device according to claim 1, wherein the amplifiers of the distributed amplification reservoir are low-noise solid state amplifiers and the reception stage of an active reception antenna.

15. The distributed amplification device according to claim 1, further comprising:
frequency band combination means comprising n inputs to receive n transmission channels and q outputs to respectively supply channels grouped together within q frequency bands into q frequency band signals, q being an integer greater than zero;

a set of dividers for dividing up the power of the q band signals over the p inputs of the input port of the distributed amplification reservoir; and gain and phase setting means corresponding to the p amplifiers over the q frequency bands.

16. The distributed amplification device according to claim 15, wherein the gain and phase setting means comprise p times q phase-shifters and attenuators arranged within the set of dividers.

* * * * *